(12) United States Patent
Sotome et al.

(10) Patent No.: US 9,029,933 B2
(45) Date of Patent: May 12, 2015

(54) NON-VOLATILE MEMORY DEVICE AND METHOD FOR MANUFACTURING SAME

(71) Applicant: Kabushiki Kaisha Toshiba, Minato-ku (JP)

(72) Inventors: Shinichi Sotome, Mie-ken (JP); Kenta Yamada, Mie-ken (JP); Wataru Sakamoto, Mie-ken (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 0 days.

(21) Appl. No.: 14/018,751

(22) Filed: Sep. 5, 2013

(65) Prior Publication Data
US 2014/0070305 A1    Mar. 13, 2014

(30) Foreign Application Priority Data
Sep. 11, 2012    (JP) .................................. 2012-199940

(51) Int. Cl.
| | |
|---|---|
| *H01L 29/788* | (2006.01) |
| *H01L 29/423* | (2006.01) |
| *H01L 29/40* | (2006.01) |
| *H01L 21/28* | (2006.01) |
| *H01L 27/115* | (2006.01) |

(52) U.S. Cl.
CPC ........ *H01L 29/42344* (2013.01); *H01L 29/401* (2013.01); *H01L 21/28273* (2013.01); *H01L 21/28282* (2013.01); *H01L 27/11524* (2013.01); *H01L 27/1157* (2013.01)

(58) Field of Classification Search
CPC ............ H01L 29/42344; H01L 29/401; H01L 27/1157; H01L 27/11524; H01L 21/28282
USPC .................. 257/316; 438/266; 365/185.11
See application file for complete search history.

(56) References Cited

U.S. PATENT DOCUMENTS

| | | | |
|---|---|---|---|
| 5,798,548 | A | 8/1998 | Fujiwara |
| 5,898,197 | A | 4/1999 | Fujiwara |
| 5,940,321 | A | 8/1999 | Takeuchi et al. |
| 5,990,514 | A | 11/1999 | Choi et al. |
| 7,411,825 | B2 | 8/2008 | Kutsukake et al. |

(Continued)

FOREIGN PATENT DOCUMENTS

| | | |
|---|---|---|
| JP | 8-115987 A | 5/1996 |
| JP | 8-139211 A | 5/1996 |
| JP | 8-306808 A | 11/1996 |
| JP | 9-36264 A | 2/1997 |

(Continued)

OTHER PUBLICATIONS

Japanese Office Action issued Dec. 24, 2014 in Patent Application No. 2012-199940 (with English language translation).

*Primary Examiner* — Tu-Tu Ho
(74) *Attorney, Agent, or Firm* — Oblon, McClelland, Maier & Neustadt, L.L.P.

(57) ABSTRACT

According to an embodiment, a non-volatile memory device includes a memory cell including a semiconductor layer, a charge storage layer provided on the semiconductor layer, and a first insulating film provided between the semiconductor layer and the charge storage layer. The device also includes a first conductive layer provided on the charge storage layer, a second conductive layer provided between the charge storage layer and the first conductive layer, a second insulating film provided between the charge storage layer and the second conductive layer, and a third insulating film provided between the first conductive layer and the second conductive layer.

12 Claims, 16 Drawing Sheets

(56) References Cited

U.S. PATENT DOCUMENTS

| | | |
|---|---|---|
| 7,898,854 B2 | 3/2011 | Kutsukake |
| 8,008,707 B2 | 8/2011 | Matsuo et al. |
| 2007/0036000 A1 | 2/2007 | Kutsukake et al. |
| 2008/0186765 A1 | 8/2008 | Kamigaichi |
| 2010/0032745 A1* | 2/2010 | Sugimachi et al. ........... 257/316 |
| 2011/0121381 A1 | 5/2011 | Kanemura et al. |
| 2012/0126299 A1 | 5/2012 | Matsuo et al. |
| 2012/0206969 A1* | 8/2012 | Gu et al. ................. 365/185.18 |

FOREIGN PATENT DOCUMENTS

| | | |
|---|---|---|
| JP | 9-326445 A | 12/1997 |
| JP | 11-163306 A | 6/1999 |
| JP | 11-224940 A | 8/1999 |
| JP | 2006-309890 A | 11/2006 |
| JP | 2007-35166 A | 2/2007 |
| JP | 2008-187051 A | 8/2008 |
| JP | 2009-205764 A | 9/2009 |
| JP | 2009-277858 A | 11/2009 |
| JP | 2011-114057 A | 6/2011 |

* cited by examiner

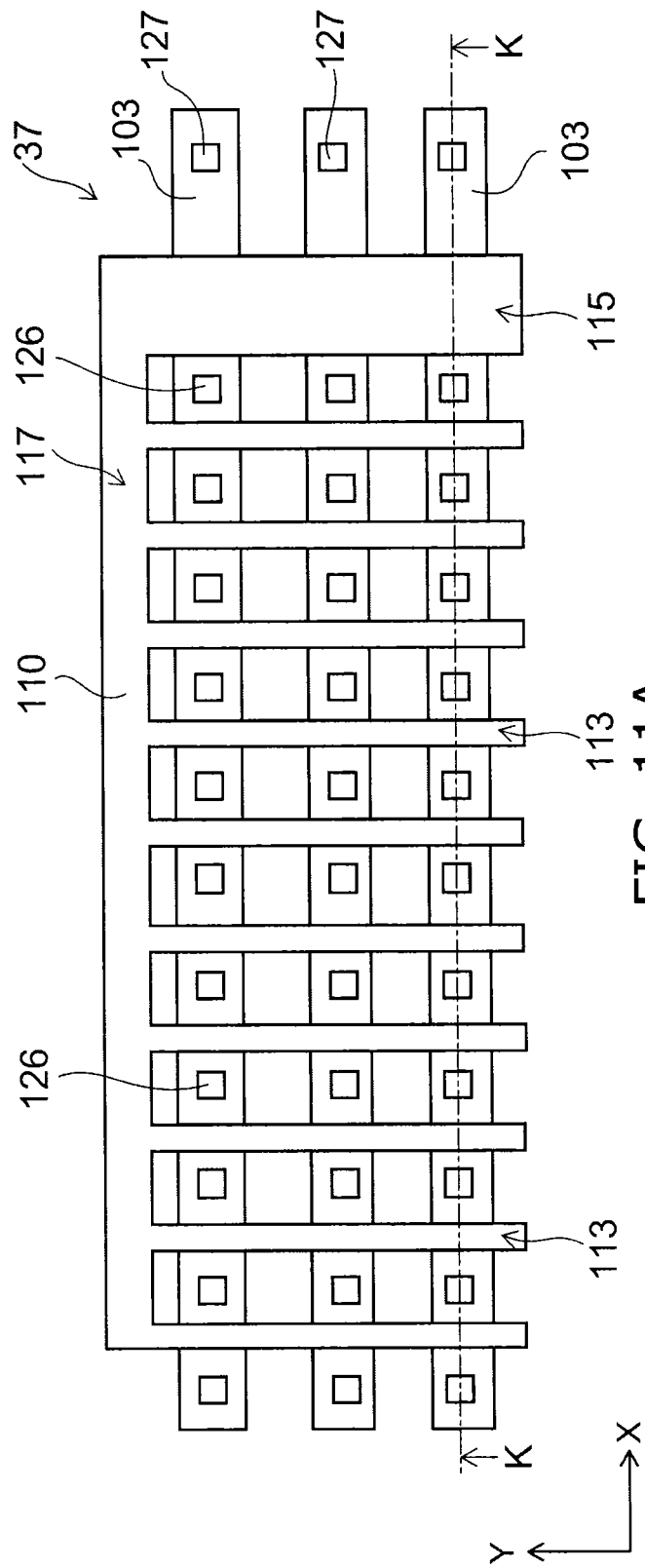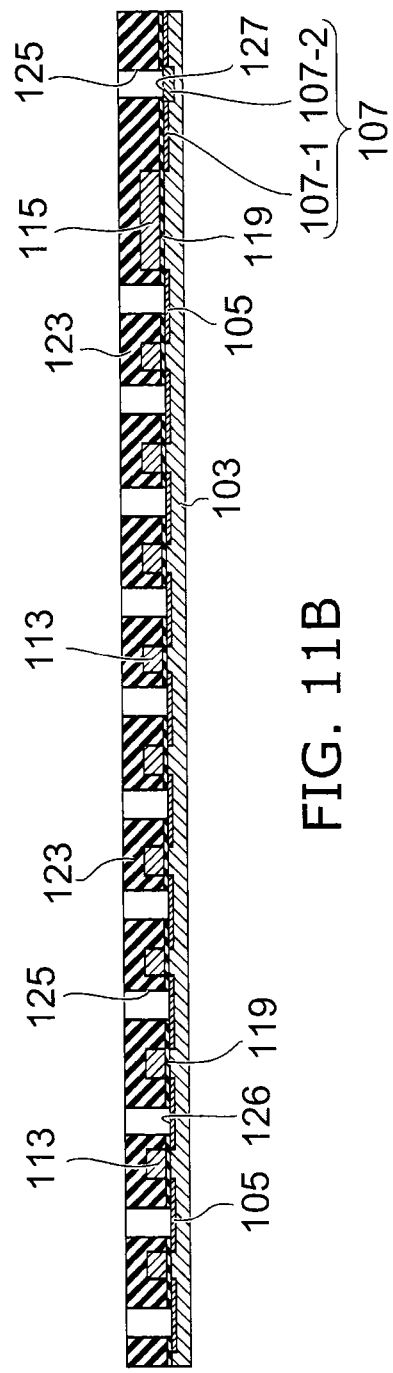
FIG. 11A
FIG. 11B

NON-VOLATILE MEMORY DEVICE AND METHOD FOR MANUFACTURING SAME

CROSS-REFERENCE TO RELATED APPLICATIONS

This application is based upon and claims the benefit of priority from Japanese Patent Application No. 2012-199940, filed on Sep. 11, 2012; the entire contents of which are incorporated herein by reference.

FIELD

Embodiments are generally related to a non-volatile memory device and a method for manufacturing the same.

BACKGROUND

A non-volatile memory device such as a NAND flash memory includes a memory cell portion and a peripheral portion. The memory cell portion stores data, and the peripheral portion includes a circuit driving the memory cell portion in accordance with signals provided from the outside for writing and erasing data. The advanced shrinking of the memory cell portion, which occupies the most part of the area of the chip, increases a memory capacity of the device. However, it is considered that the shrinking of the memory cell may easily induce a variation of charge amount retained in each memory call, an operating delay, and the like, influencing the performance of the memory device. Thus, a non-volatile memory device and a method for manufacturing the same are required, which has a memory cell capable of retaining data for a long time, and improves the operating speed.

BRIEF DESCRIPTION OF THE DRAWINGS

FIGS. 11A and 11B are exemplary views schematically showing the switch element according to the first embodiment;

DETAILED DESCRIPTION

Figure 1:
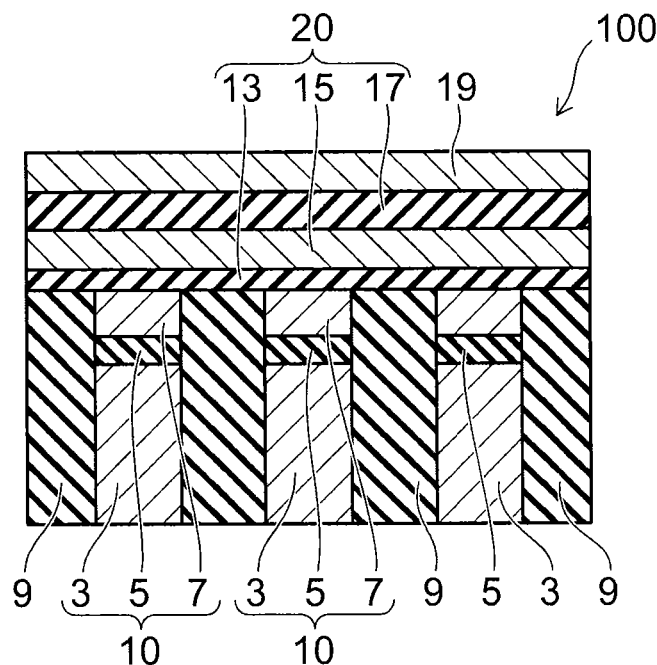
FIG. 1 is an exemplary view schematically showing a memory cell of a non-volatile memory device according to a first embodiment.

According to an embodiment, a non-volatile memory device includes a memory cell including a semiconductor layer, a charge storage layer provided on the semiconductor layer, and a first insulating film provided between the semiconductor layer and the charge storage layer. The device also includes a first conductive layer provided on the charge storage layer, a second conductive layer provided between the charge storage layer and the first conductive layer, a second insulating film provided between the charge storage layer and the second conductive layer, and a third insulating film provided between the first conductive layer and the second conductive layer.

Hereinbelow, embodiments are described with reference to the drawings. Identical components in the drawings are marked with the same reference numerals, and a detailed description thereof is omitted as appropriate and different components are described.

The drawings are schematic or conceptual; and the sizes and proportions of portions are not necessarily the same as the actual values thereof. Further, the sizes and proportions may be illustrated differently among drawings, even for identical portions.

First Embodiment

FIG. 1 is an exemplary view schematically showing a memory cell of a non-volatile memory device 100 according to a first embodiment. The non-volatile memory device 100 is a NAND multiple-value flash EEPROM (electrically erasable programmable read-only memory), for example.

Figure 3A:
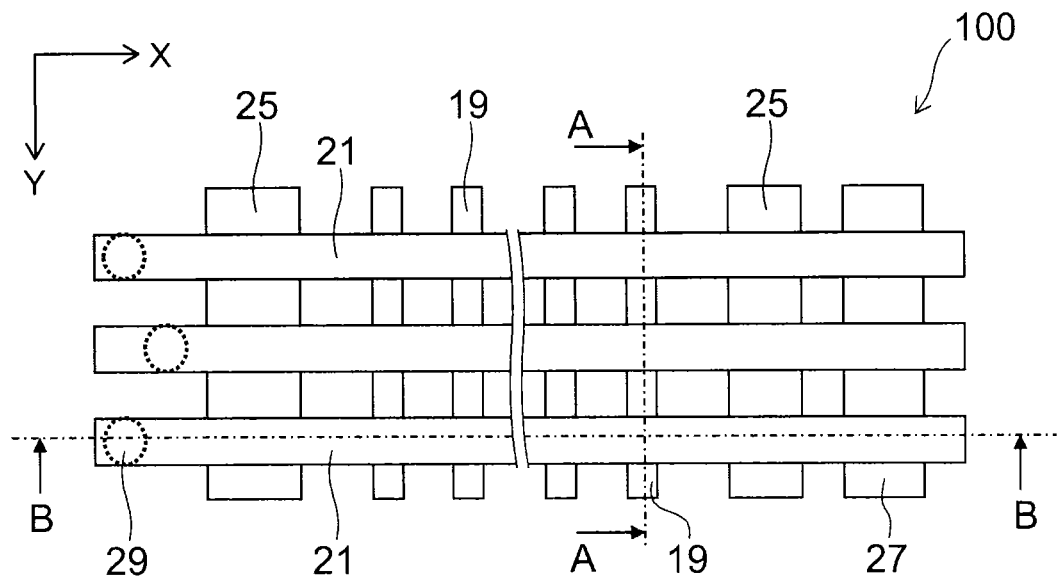
FIGS. 3A and 3B are exemplary views schematically showing the non-volatile memory device according to the first embodiment.

FIG. 1 schematically shows a memory cell 10 in a cross section orthogonal to a memory string of the non-volatile memory device 100 (the A-A cross section shown in FIG. 3A). The memory cell 10 includes a semiconductor layer 3 and a charge storage layer 7 provided on the semiconductor layer 3. A first insulating film (hereinafter, an insulating film 5) is provided between the semiconductor layer 3 and the charge storage layer 7.

As shown in FIG. 1, memory cells 10 are aligned in a direction orthogonal to the memory string. An STI (shallow trench isolation) 9 is provided between memory cells 10, and electrically insulates a memory cell 10 from the other. In the embodiment, the upper surface of the STI 9 and the upper surface of the charge storage layer 7 are formed so as to be at the same height as possible. A control gate 19 that is a first conductive layer is provided on the charge storage layer 7 and the STI 9 via an IPD (inter-layer dielectric) 20.

In the memory cell 10, the amount of charge stored in the charge storage layer 7 can be controlled by a potential difference applied between the control gate 19 and the semiconductor layer 3. The memory cell 10 stores information corresponding to the amount of charge retained in the charge storage layer 7.

The IPD 20 in the embodiment includes a second conductive layer (hereinafter, a conductive layer 15) provided between the charge storage layer 7 and the control gate 19, a second insulating film (hereinafter, an insulating film 13), and a third insulating film (hereinafter, an insulating film 17). The insulating film 13 electrically insulates the conductive layer 15 from the charge storage layer 7 and, and the insulating film 17 electrically insulates the conductive layer 15 from the control gate 19.

The conductive layer 15 is a metal film, for example, and the insulating film 13 and the insulating film 17 are a silicon oxide film, for example. The conductive layer 15 may reduce the electric field applied to the insulating film 13, and suppresses the charge leakage from the charge storage layer 7 to the IPD 20.

Figure 2:
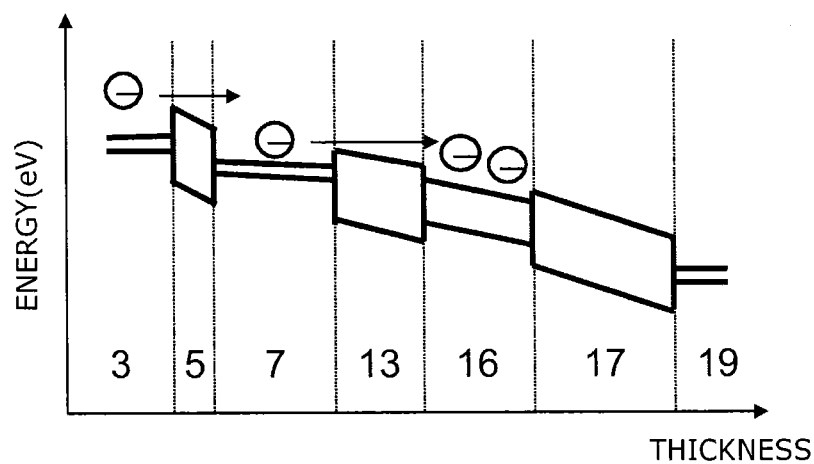
FIG. 2 is a schematic diagram showing an energy band structure of a memory cell according to a comparative example.

FIG. 2 is an exemplary diagram schematically showing the energy band structure of a memory cell according to a comparative example. The horizontal axis represents a position of each layer in the stacked direction layers from the semiconductor layer 3 to the control gate 19. The vertical axis represents the potential energy (eV).

Various layer structures may be applied for the IPD provided between the charge storage layer 7 and the control gate 19. For example, a stacked film, so called an ONO film or a NONON film may be used, which has a multi-layer structure including silicon oxide films and a silicon nitride films, and a NOAON film is also used, which has a multi-layer structure including silicon oxide films, silicon nitride films and an alumina film. Electrons trapped in at least one of films may improve the insulating properties of these stacked films.

In the example of FIG. 2, the IPD is an ONO film in which the insulating film 13 (a silicon oxide film), an insulating film 16 (a silicon nitride film), and the insulating film 17 (a silicon oxide film) are stacked in this order from the charge storage layer 7 side. The drawing shows a case where a plus voltage is applied to the control gate 19 with respect to the semiconductor layer 3. That is, it represents a state where a write voltage is applied to the control gate 19.

As shown in FIG. 2, electrons are injected from the semiconductor layer 3 into the charge storage layer 7 via the insulating film 5. Part of the electrons injected in the charge storage layer 7 may move to the insulating film 16 via the insulating film 13. The part of the electrons that move to the insulating film 16 are trapped therein, and reduces the electric field strength applied to the insulating film 13 and suppresses a leak current.

However, they can move to the outside of the IPD, since the electrons trapped in the insulating film 16 are not a fixed charge. That is, when the write voltage is switched to OFF and a certain charge is stored in the charge storage layer 7, electrons trapped in the insulating film 16 may move to the outside of the IPD, changing a threshold voltage of the memory cell. In addition, the amount of electrons trapped in the insulating film 16 may be different in the memory cells from each other, and the threshold amount may vary from cell to cell. For example, the amount of electrons trapped in the insulating film 16 depends on the amount of electrons injected in the charge storage layer 7. The amount of electrons trapped in the insulating film 16 is larger in a memory cell written with a higher threshold. Accordingly, the threshold change induced by detrapping or removing electrons becomes larger in a memory cell with a higher threshold. Even when writing with the same voltage, a difference in the electron injection amount and a difference in the electron trap amount originated with ununiformity of a manufacturing process may include a threshold variation from cell to cell. As a result, it may cause the data retention error in each cell and degrade the reliability of stored data.

In contrast, the conductive layer 15 is provided in the embodiment, in place of the insulating film 16, for example. Electrons injected from an external power source into the conductive layer 15 may reduce the electric field strength applied to the insulating film 13, and may prevent electrons from removing from the charge storage layer 7. That is, the conductive layer 15 may improve the controllability of the electric field strength applied to the insulating film 13, and may stabilize the threshold voltage of each memory cell. Consequently, the stored data in the memory cell may become more reliable.

Figure 3B:
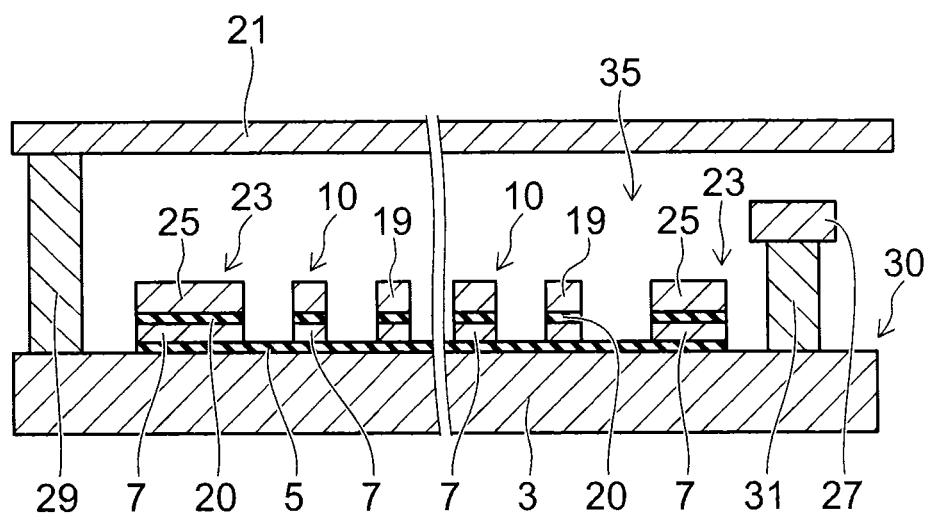

FIGS. 3A and 3B are exemplary views schematically showing the non-volatile memory device 100 according to the first embodiment. FIG. 3A is a plan view showing a memory cell portion, and FIG. 3B is a cross-sectional view taken along line B-B shown in FIG. 3A.

As shown in FIG. 3A, the memory cell portion includes bit lines 21 and control gates 19 crossing the bit lines 21. The bit line 21 extends in the X direction that is a first direction, for example. The control gate 19 extends in the Y direction (a second direction) orthogonal to the X direction. A select gate 25 is provided on both sides of the control gates 19. A source line 27 is provided on a side of the select gate 25 opposite to the control gate 19.

As shown in FIG. 3B, a memory string 30 is provided below the bit line 21, and extends in the X direction. The memory string 30 includes the semiconductor layer 3 in a stripe shape extending in the X direction and memory cells 10. Each memory cell 10 includes part of the semiconductor layer 3 therebeneath.

The memory cell 10 is disposed at a portion where the control gate 19 intersects the memory string 30. A select transistor 23 is provided at the intersection of the memory string 30 and the select gate 25. The select transistor 23 is a MOS transistor using the insulating film 5, the charge storage layer 7, and the IPD 20 as a gate insulating film. The select transistor 23 changes an ON state of the current flowing through the memory string 30 to an OFF state thereof and vice versa depending on a voltage applied to the select gate 25, for example.

An interlayer insulating film 35 covering the memory cell 10 and the select transistor 23 is provided between the bit line 21 and the memory string 30. The memory string 30 is electrically connected to the bit line 21 via a drain contact 29. On the other hand, the source line 27 is electrically connected to the memory string 30 via a source contact 31. Two select gates 25 and memory cells 10 are provided between the drain contact 29 and the source line 31, and the memory cells 10 are disposed between the two select gates 25.

Figure 4A:
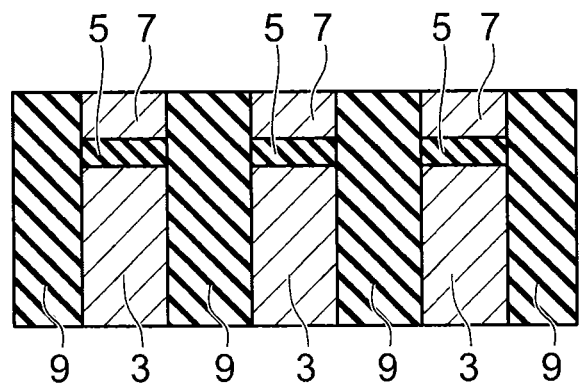
FIGS. 4A to 4C are exemplary cross-sectional views schematically showing the manufacturing process of the non-volatile memory device according to the first embodiment.
Figure 4B:
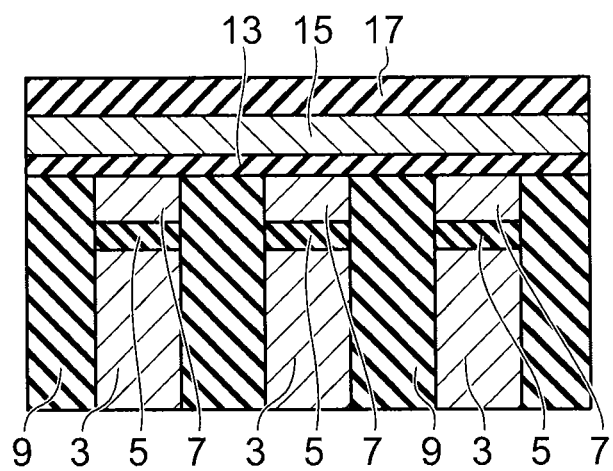
Figure 4C:
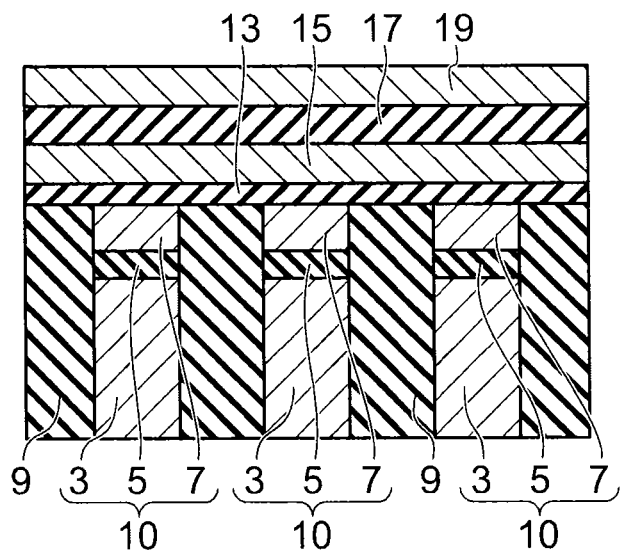

FIG. 4A to FIG. 4C are exemplary cross-sectional views schematically showing the manufacturing process of the non-volatile memory device 100 according to the first embodiment. The drawings show a cross section taken along line A-A shown in FIG. 3A.

First, the insulating film 5 and the charge storage layer 7 are stacked on the semiconductor layer 3. The semiconductor layer 3 is a p-type silicon layer, and is provided on a silicon wafer, for example. Alternatively, a p-type silicon wafer may be used in place of the semiconductor layer 3. The insulating film 5 is a silicon oxide film formed by thermally oxidizing the semiconductor layer 3, for example. The charge storage layer 7 is a silicon nitride film formed using the CVD method, for example. Alternatively, the charge storage layer 7 may be a polysilicon film.

Subsequently, the insulating film 5 and the charge storage layer 7 are formed in a line-and-space pattern extending in the X direction on the surface of the semiconductor layer 3, and then the STI 9 is buried in the space as shown in FIG. 4A. The STI 9 is polished using the CMP method, for example, so that the upper surface thereof locates the same level as the upper surface of the charge storage layer 7.

Next, the insulating film 13, the conductive layer 15, and the insulating film 17 are sequentially stacked so as to form the IPD 20 on the charge storage layer 7 and the STI 9. The conductive layer 15 is not only a metal film, but also a conductive film made of tungsten nitride (WN) or the like, for example. Alternatively metal silicide and conductive polysilicon may be used for the conductive layer 15.

Next, the control gate 19 is formed on the insulating film 17. The control gate 19 is a conductive polysilicon film, and is formed in a stripe pattern crossing the memory string 30. Specifically, a polysilicon film formed on the insulating film 17 is etched into a stripe pattern extending in the Y direction. At the same time, the charge storage layer 7 and the IPD 20 are etched into the same stripe configuration to form memory cells 10. The control gate 19 serves as a word line that controls the memory cell 10, and is connected to a peripheral circuit.

Figure 5A:
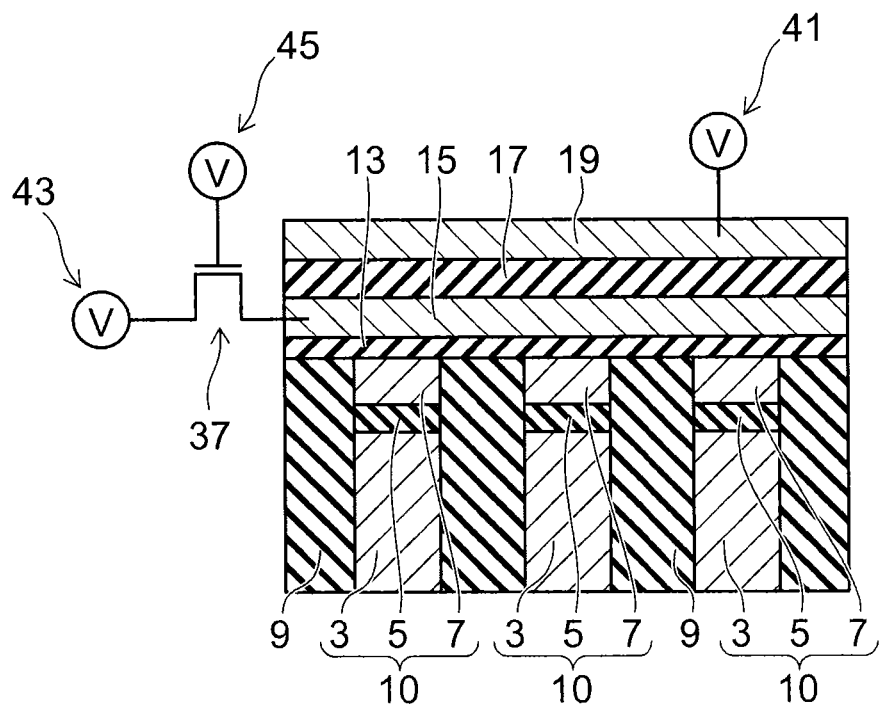
FIGS. 5A and 5B are exemplary diagrams schematically showing operations of the non-volatile memory device according to the first embodiment.
Figure 5B:
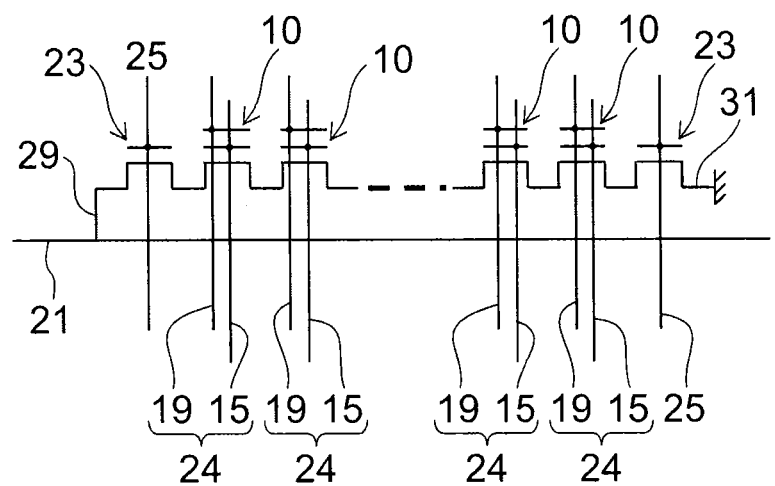

FIGS. 5A and 5B are exemplary diagrams schematically showing operations of the non-volatile memory device 100 according to the first embodiment. FIG. 5A is a schematic cross-sectional view showing a method for controlling the conductive layer 15, and FIG. 5B is a schematic diagram showing an equivalent circuit of the memory cell portion.

As shown in FIG. 5A, a control voltage 41 is applied to the control gate 19 for controlling the charge amount in the charge storage layer 7. On the other hand, a control voltage 43 is applied to the conductive layer 15 via a switch element 37. The switch element 37 is a MOS (metal oxide semiconductor) transistor that is switched by a gate bias 45 from the ON state to the OFF state and vice versa, and controls the charge in the conductive layer 15, for example. Table 1 shows exemplary charge states of the conductive layer 15 corresponding to operational states of the non-volatile memory device 100.

TABLE 1

|  | Conductive Layer | Charge in Conductive Layer |
|---|---|---|
| Program | Floating | Charged |
| Verify-Read | Floating | Charged or 0 V |
| Read | Floating | 0 V |

When information is written on the memory cell 10, charges are injected into the conductive layer 15, for example. Specifically, the switch element 37 is set to the ON state to apply a control voltage 43 to the conductive layer 15, and a minus charge is transferred into the conductive layer 15. The control voltage 43 is a lower potential than the control voltage 41 applied to the control gate 19, and is set in a range from 1 V to 2 V, for example. The control voltage 43 is preferably set to a value less than 5 V, for example, that cause no charge injection into the charge storage layer 7 via the insulating film 5. Subsequently, the switch element 37 is switched to the OFF state to keep the conductive layer 15 at a floating potential.

The charged conductive layer 15 may reduce the electric field strength in the insulating film 13, which is induced by applying the control voltage 41 to the control gate 19, and suppresses a current leak from the charge storage layer 7 to the control gate 19. That is, it becomes possible to suppress the variation of the charge amount retained in the charge storage layer 7.

When reading the information in the memory cell 10, the conductive layer 15 is discharged. That is, the control voltage 43 is set to be 0 V or the ground (GND) potential, and the switch element 37 is switched to the ON state. Then, after discharging the conductive layer 15, the switch element 37 is switched to the OFF state, keeping the conductive layer 15 at a floating potential. Thereby, it becomes possible to accurately read out the information corresponding to the charge stored in the charge storage layer 7.

In the verify-read mode, the information is verified after writing it on the memory cell 10, and the conductive layer 15 is kept in one of the charged state and the discharged state. When the information is read out after discharging the conductive layer 15 as mentioned above, the accuracy of reading can be improved, for example. However, repeating charging and discharging the conductive layer 15 in verify-reading increases total write time. Thus, it is preferable to perform the verify-reading while the conductive layer 15 is charged.

When charging the conductive layer 15, an amount of the charge in the conductive layer 15 changes the threshold voltage of the memory cell 10, but the change amount of the threshold voltage in each memory cell is equal to other memory cells that sharing the conductive layer 15. Hence, in verify-reading, it may be possible to carry out shift-reading in a common page, or to add an offset on the verify-read voltage beforehand on the basis of an expectation change of the threshold voltage. Thereby, it becomes possible to read out the information accurately in verify-reading.

As mentioned above, in the non-volatile memory device 100 according to the embodiment, each memory cell 10 is controlled by the conductive layer 15 in addition to the control gate 19. Thus, as shown in the equivalent circuit of FIG. 5B, the control gate 19 and the conductive layer 15 are drawn out from the memory cell portion as a word line 24, and the word lines 24 are connected to a peripheral circuit.

Next, a manufacturing flow of the extension portion of the word line 24 is described with reference to FIG. 6A to FIG. 8C.

Figure 6A:
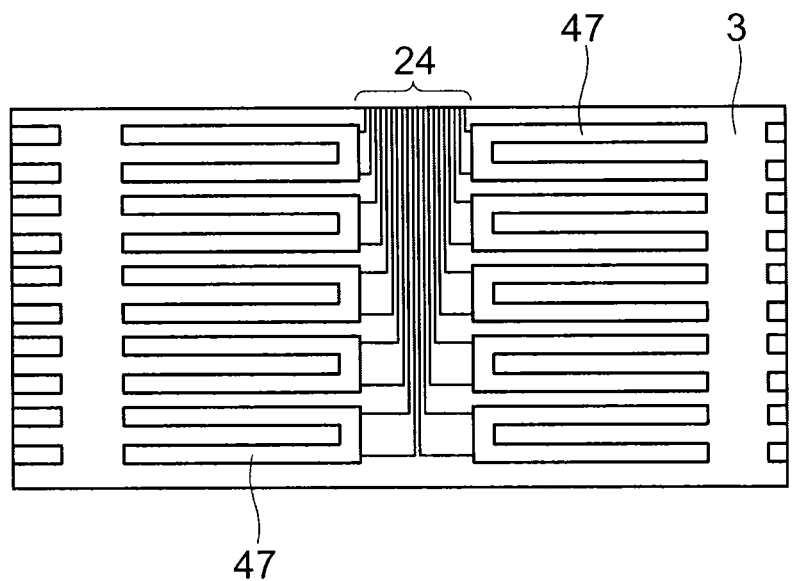
FIGS. 6A to 6C are exemplary views schematically showing part of the word line of the non-volatile memory device according to the first embodiment.
Figure 6B:
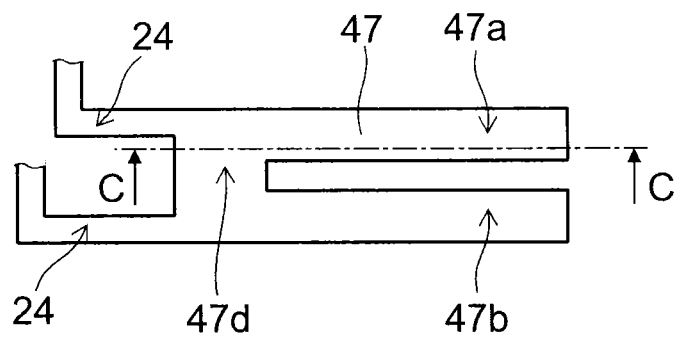
Figure 6C:
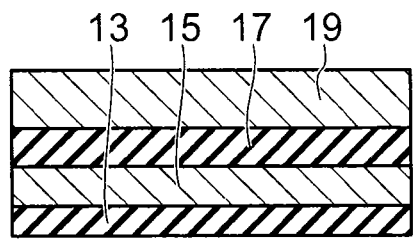

FIG. 6A to FIG. 6C are exemplary views schematically showing part of the word line 24 of the non-volatile memory device 100 according to the first embodiment. Specifically, the drawings are plan views of an extension portion of the word line 24 including a pattern of contact portions 47. FIG. 6A is a plan view showing the extension portion, and FIG. 6B is an enlarged plan view of the contact portion 47. FIG. 6C is a cross-sectional view taken along line C-C shown in FIG. 6B.

The word line 24 is a fine interconnection formed using so called the sidewall processing method, for example. That is, the word lines 24 adjacent to each other are formed with a small spacing of 20 nm or less, for example, and two of the word lines are linked in the end portions. The end portions thereof are provided with a wider species in a peripheral region around the memory cell portion, so that two word lines 24 linked in the end portion (herein after the contact portion 47) are capable of dividing with photolithography into two word lines 24 that are electrically separated from each other. Thus, as shown in FIGS. 6A and 6B, the contact portion 47 is formed into an intermediate pattern including two contact portions 47a and 47b.

As shown in FIG. 6C, the contact portion 47 has a staked structure in which the insulating film 13, the conductive layer 15, the insulating film 17, and the control gate 19 are provided in order. The stacked structure may include the charge storage layer 7 and the insulating film 5 beneath the insulating film 13.

Figure 7A:
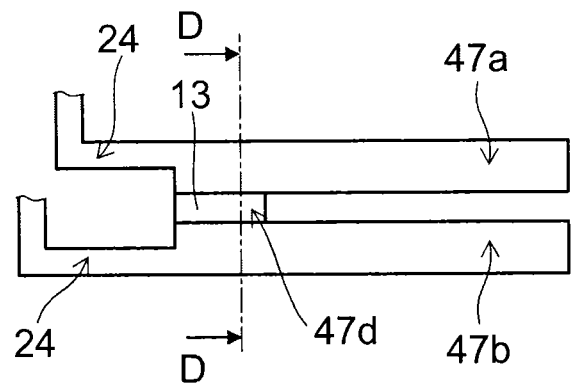
FIGS. 7A to 7D are exemplary cross-sectional views schematically showing the manufacturing process of the non-volatile memory device according to the first embodiment.

Next, as shown in FIG. 7A, the contact portion 47a and the contact portion 47b are electrically isolated from each other. For example, part of the stacked layers from the control gate 19 to the conductive layer 15 is removed using the RIE method in the connection portion 47d between the contact portion 47a and the contact portion 47b. Thereby, the contact portion 47a and the contact portion 47b are electrically isolated, and the word lines 24 connected to them are electrically isolated from each other.

Figure 7B:
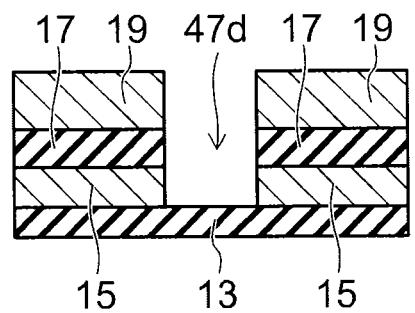

FIG. 7B is a cross sectional view taken along line D-D shown in FIG. 7A. As shown in FIG. 7B, the conductive layers 15 included in the contact portions 47a and 47b are separated from each other. Each conductive layer 15 joins any one of the memory cells 10, and electrically insulated from other. The control gates 19 of the contact portions 47a and 47b are separated from each other. Each control gate 19 joins any one of the memory cells 10, and electrically insulated from other.

Figure 7C:
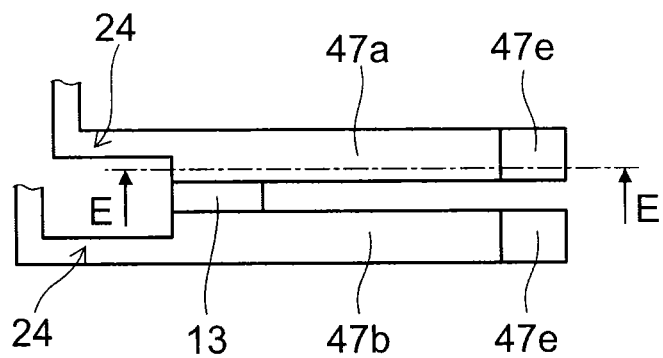
Figure 7D:
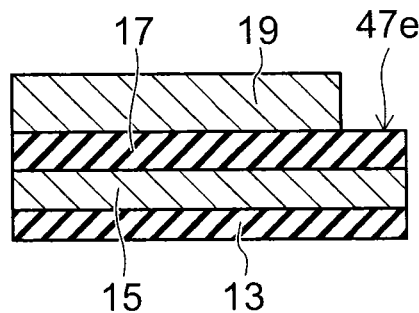

Subsequently, as shown in FIG. 7C and FIG. 7D, each part of the control gates 19 at the ends of the contact portions 47a and 47b is selectively removed to expose the upper surface 47e of the insulating film 17. Here, FIG. 7D is a cross-sectional view taken along line E-E shown in FIG. 7C.

Next, the interlayer insulating film 35 that covers the contact portion 47a and the contact portion 47b is formed (see FIG. 3B). Then, contact holes (not shown) in communication with the contact portions 47a and 47b are formed respectively, and a contact 19a (a first contact) and a contact 15a (a second contact) shown in FIG. 8A are exposed.

Thus, the contact 19a of the control gate 19 and the contact 15a of the conductive layer 15 are formed in each of the contact portions 47a and 47b.

Figure 8A:
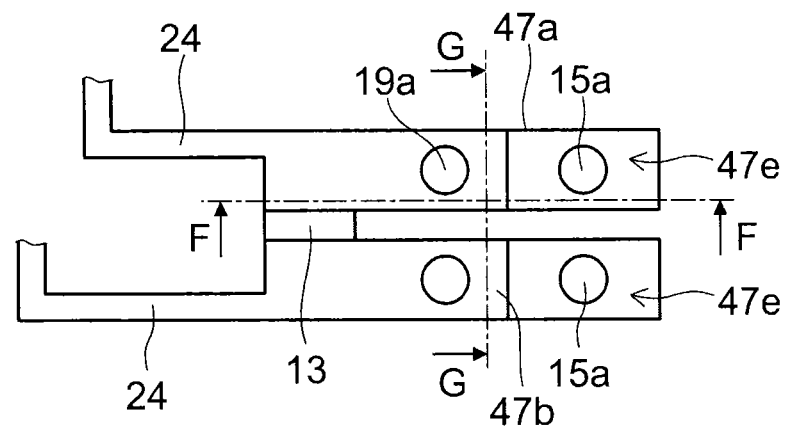
FIGS. 8A to 8C are exemplary views schematically showing part of the word line of the non-volatile memory device according to the first embodiment.
Figure 8B:
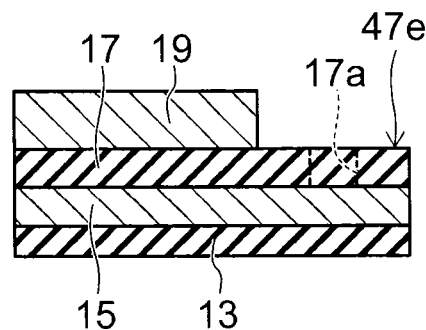
Figure 8C:
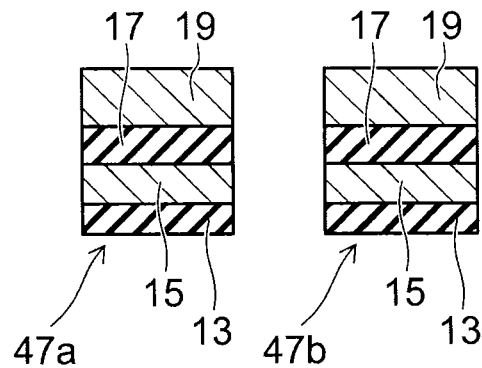

FIG. 8B is a cross-sectional view taken along line F-F shown in FIG. 8A, and FIG. 8C is a cross-sectional view taken along line G-G shown in FIG. 8A.

As shown in FIG. 8B, at one end of the conductive layer 15, the contact 15a is exposed at the bottom of an opening 17a formed in the insulating film 17. The contact 15a of the conductive layer 15 can be exposed by sequentially etching the interlayer insulating film 35 (see FIG. 3B) and the insulating film 17, for example.

As shown in FIG. 8C, the insulating film 13 is also divided into the separated protons in the cross-sectional view taken along line G-G. The word line 24 may have the same cross-sectional structure as shown in FIG. 8C.

Figure 9A:
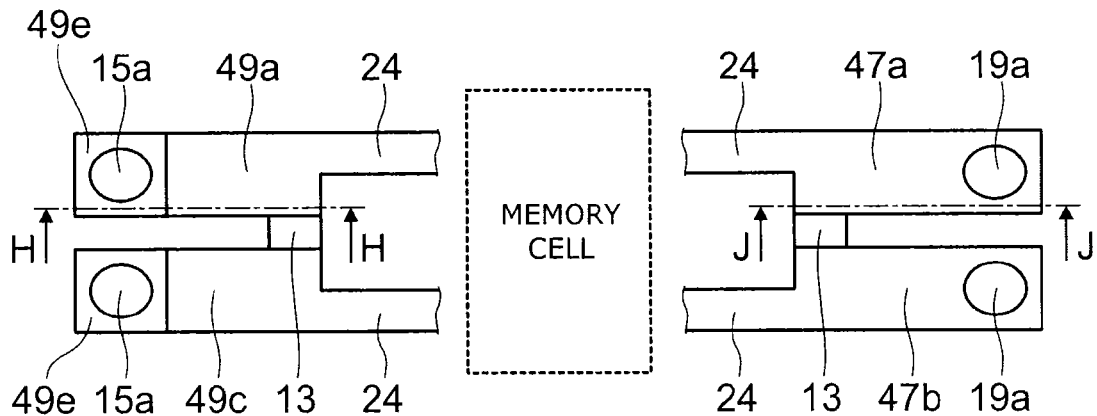
FIGS. 9A to 9C are exemplary views schematically showing part of the word line of the non-volatile memory device according to a variation of the first embodiment.
Figure 9B:
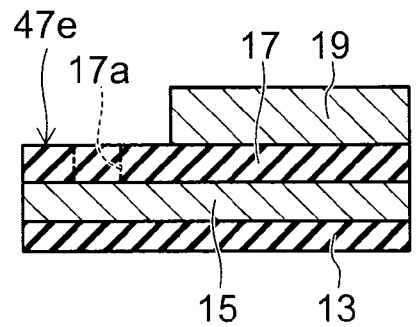
Figure 9C:
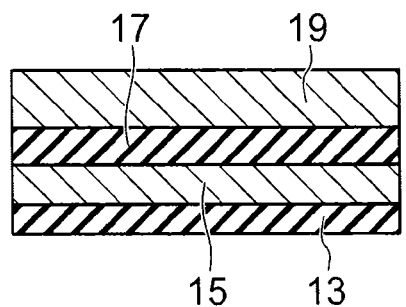

FIGS. 9A to 9C are schematic views showing part of a word line of a non-volatile memory device according to a variation of the first embodiment. FIG. 9A is a plan view showing contact portions 47a and 47b, and contact portions 49a and 49b. FIG. 9B is a cross-sectional view taken along line H-H shown in FIG. 9A, and FIG. 9C is a cross-sectional view taken along line J-J shown in FIG. 9A.

In this example, the contact 15a of the conductive layer 15 is provided individually in each of the contact portions 49a and 49b. On the other hand, the contact 19a of the control gate 19 is provided individually in each of the contact portions 47a and 47b.

As shown in FIG. 9B, the control gate 19 is selectively removed, and an opening 17a in communication with the conductive layer 15 is provided at each end of the contact portions 49a and 49b. On the other hand, the contact 19a is formed on the surface the control gate 19 as shown in FIG. 9C, wherein the control gate 19 covers the entire surfaces of the contact portions 47a and 47b.

Thus, the contact 19a of the control gate 19 and the contact 15a of the conductive layer 15 may be provided respectively in different contact portions. For example, the extension portion of the control gate 19 is provided on one side of the memory cell portion, and the extension portion of the conductive layer 15 is provided on another side of the memory cell portion.

Figure 10:
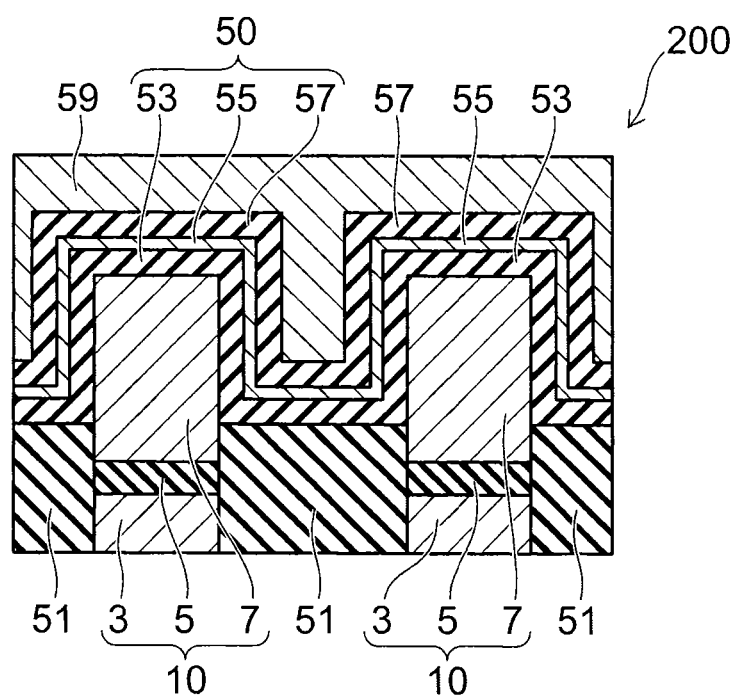
FIG. 10 is an exemplary view schematically showing a memory cell of a non-volatile memory device according to a variation of the first embodiment.

FIG. 10 is an exemplary cross-sectional view schematically showing a non-volatile memory device 200 according to another variation of the embodiment. FIG. 10 shows the structure of the memory cell 10 in a cross section perpendicular to the memory string.

The memory cell 10 includes the semiconductor layer 3, the insulating film 5, and the charge storage layer 7. The charge storage layer 7 is provided on the semiconductor layer 3 via the insulating film 5. An STI 51 is provided between adjacent memory cells 10, and electrically insulates one memory cell 10 from the other memory cell 10.

In this example, the upper surface of the STI 51 is provided in a position lower than the upper surface of the charge storage layer 7. An IPD 50 covers the upper surface and the side surface of the charge storage layer 7 protruding from the upper surface of the STI 51. A control gate 59 (the first conductive layer) is provided on the IPD 50.

The IPD 51 includes an insulating film 53 (the first insulating film), a conductive layer 55 (the second conductive layer), and an insulating film 57 (the third insulating film) in order from the charge storage layer 7. A metal film may be used as the conductive layer 55, for example. The conductive layer 55 has the same function as the conductive layer 15 of the non-volatile memory device 100 shown in FIG. 1, and exhibits similar advantages.

Thus, a conductive layer provided in part of the IPD improves the controllability of the charge amount in each memory cell in the non-volatile memory device according to the embodiment. Thereby, it becomes possible to suppress a current leak through the charge storage layer, and then to improve the insulating properties of the IPD and data retention in the memory cell. At the same time, the threshold variation from a memory cell to a memory cell may also be suppressed, thereby improving reliability of data stored in the memory cell.

As mentioned above, the device according to the embodiment comprises an exemplary IPD that includes silicon oxide films and a conductive layer, but the configuration of the IPD is not limited thereto. For example, the IPD may also have a multiple-layer structure which includes a silicon oxide film, a silicon nitride film, and a conductive layer.

Next, examples of the switch element 37 and the arrangement thereof are described with reference to FIGS. 11A to 14B.

FIGS. 11A and 11B are exemplary views schematically showing the switch element 37 according to the first embodiment. FIG. 11A is a plan view of the switch element 37 as viewed from the upper side thereof. FIG. 11B is a cross-sectional view taken along line K-K shown in FIG. 11A.

As shown in FIG. 11A, the switch element 37 includes a semiconductor layer 103 having a stripe shape extending in the X direction. The switch element 37 includes semiconductor layers 103, for example. The semiconductor layers 103 are aligned in the Y direction and disposed in parallel.

A gate electrode 110 is provided on the semiconductor layers 103. The gate electrode 110 includes first extension portions (hereinafter, extension portions 113), a second extension portion (hereinafter, an extension portion 115), and a connection portion 117 electrically connecting the extension portions 113 and the extension portion 115. The extension portion 113 and the extension portion 115 extend in a direction crossing the semiconductor layer 103.

As shown in FIG. 11B, the extension portion 113 and the extension portion 115 are provided on the semiconductor layers 103 via a fourth insulating film (hereinafter, a gate insulating film 119). In the semiconductor layer 103, a first source drain region (hereinafter, a source drain region 105) is provided between extension portions 113 aligned in the X direction. A source drain region 105 is provided on one side of the extension portion 115, that is, between the extension portion 113 and the extension portion 115. A second source drain region (a source drain region 107) is provided on the other side of the extension portion 115. The conductivity type of the source drain region 105 and 107 are different from the conductivity type of the semiconductor 103. For example, when the conductivity type of the semiconductor layer 103 is the P type, the conductivity type of the source drain regions 105 and 107 is the N type.

The switch element 37 is covered with an interlayer insulating film 123, for example, and contact holes 125 in communication with the source drain regions 105 and 107 respectively, are provided in the interlayer insulating film 123. A contact 126 of the source drain region 105 and a contact 127 of the source drain region 107 are exposed respectively at the bottom surfaces of the contact holes 125.

The source drain region 105 is electrically connected to the conductive layer 15 (see FIGS. 5A and 5B) via a plug provided in the contact hole 125 and an interconnection provided on the interlayer insulating film 123, for example.

The source drain region 107 is electrically connected to a power source 43 via a plug provided in the contact hole 125, and an interconnection provided on the interlayer insulating film 123, for example. The source drain region 107 has a first portion 107-1 provided in a whole surface of the semiconductor layer 103 on the other side of the extension portion 115, and a second portion 107-2 provided in a surface of the semiconductor layer 103 exposed at the bottom of the contact hole 125. The second portion 107-2 has an n-type impurity concentration higher than that of the first portion 107-1. The n-type impurity concentration in the first portion 107-1 may be equal to that in the source drain region 105. The plugs are in contact with the contact 126 and 127 respectively at the bottom surface of the contact hole 125.

The extension portion 115 of the gate electrode 110 switches the electrical continuity on and off between the source drain region 105 and the source drain region 107. The extension portion 113 switches the electrical continuity on and off between adjacent source drain regions 105 among the source drain regions 105 aligned in the semiconductor layer 103.

When a gate bias is applied to the gate electrode 110, an inversion channel is formed at the interface between the semiconductor layer 103 and the gate insulating film 119, and provides electrical connections between the source drain regions 105 and 107, and between source drains 105. Thereby, it becomes possible to provide charges from the power source 43 to the conductive layers 15. Subsequently, the gate bias is switched to the OFF state, thereby cutting off the electrical connection between source drain regions.

In other words, the switch element 37 includes first transistors and second transistors. Each first transistor includes the extension portion 115 as a gate electrode, the source drain regions 105 provided on one side of the extension portion 115, the source drain regions 107 provided on the other side of the extension portion 115, and the gate insulating film 119. Each second transistor includes one of the extension portions 113 as a gate electrode, the source drain regions 105 provided on both sides thereof, and the gate insulating film 119.

The extension portion 115 is provided so as to enable the on/off switching of the high voltage outputted from the power source 43. The gate insulating film 119 is provided thicker than the insulating film 5 of the memory cell 10, for example. On the other hand, the extension portion 113 keeps the voltage difference between conductive layers 15, and thus may be configured to be capable of sustaining a low voltage. For example, the channel length (the width in the X direction) of the extension portion 113 may be shorter than the channel length of the extension portion 115. In other words, a width of the extension portion 115 is larger than that of the extension portion 113. Thereby, it becomes possible to shrink the portion where a large number of contacts 126 are provided. Furthermore, one power source 43a may provide charges to conductive layers 15 through one contact 127. Therefore, the switch element 37 can be downsized according to the embodiment.

Figure 12A:
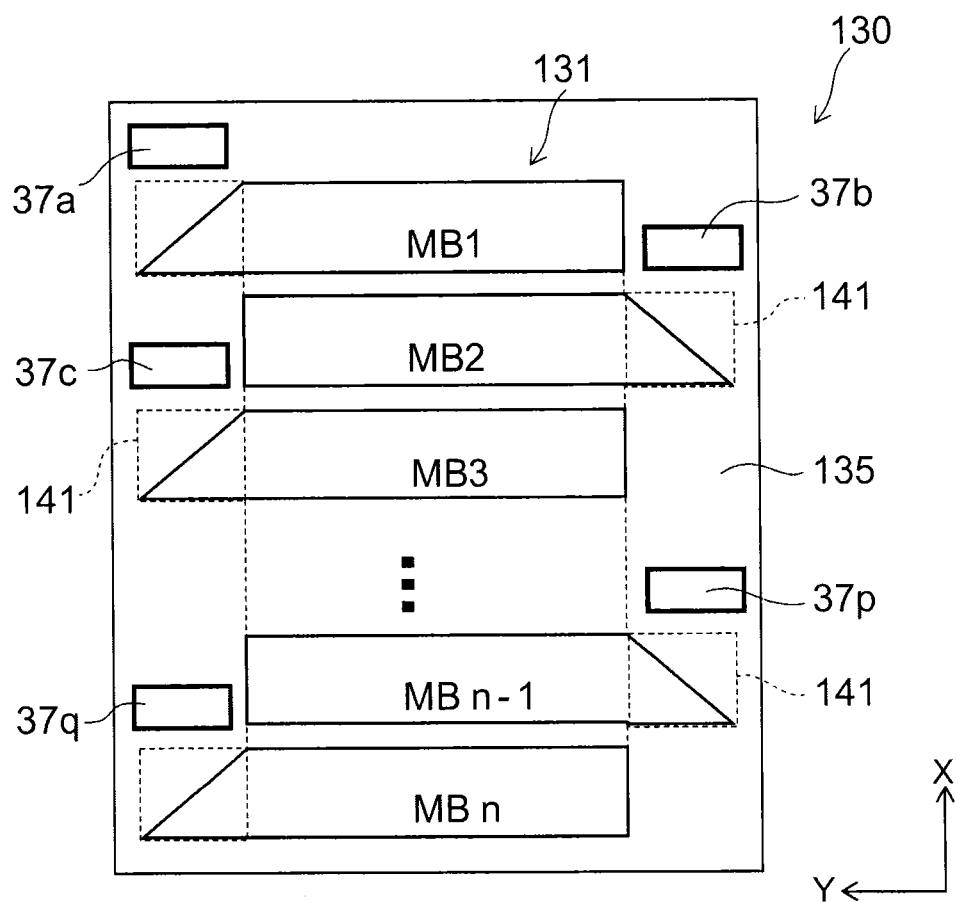
FIGS. 12A and 12B are exemplary plan views schematically showing a memory cell portion according to the first embodiment.
Figure 12B:
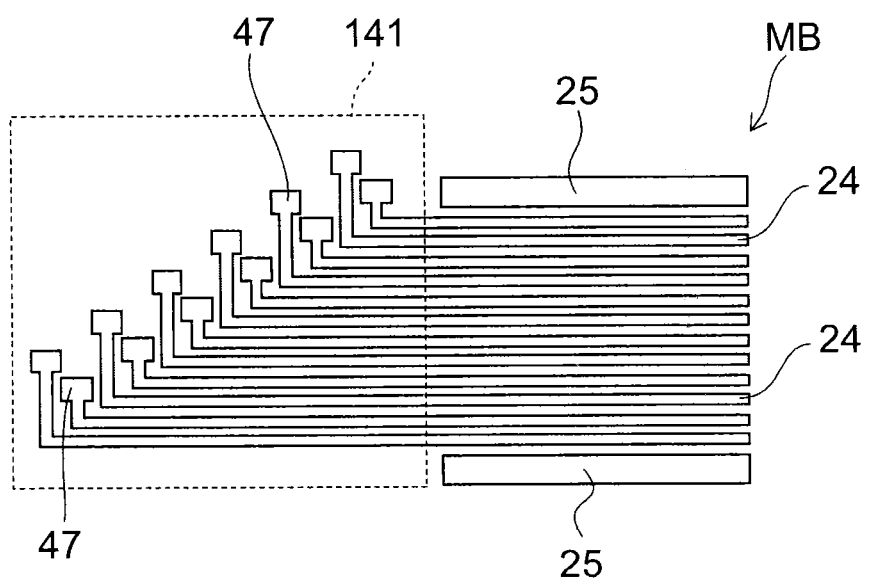

FIGS. 12A and 12B are exemplary plan views schematically showing a memory cell portion 131 according to the first embodiment. FIG. 12A is a plan view showing a memory cell well 130 provided in a silicon wafer, for example. FIG. 12B is an enlarged plan view of the extension portion 141 of the word line 24.

As shown in FIG. 12A, the memory cell well 130 includes the memory cell portion 131 and an outer peripheral portion 135 thereof. The memory cell portion 131 includes memory blocks MB1 to MBn. Each memory block MB includes memory strings 30, and the memory string 30 includes memory cells 10 (see FIG. 3B). The outer peripheral portion 135 includes the extension portion 141 of the word line 24 and switch elements 37a to 37q.

The memory cell well 130 is a P-type semiconductor layer provided in a silicon wafer, for example. Part of the P-type semiconductor layer in the memory cell portion 131 is formed into the semiconductor layer 3 having a stripe shape extending in the X direction, and provides the memory string 30 including the memory cells 10 (see FIG. 3B). On the other hand, another part of the P-type semiconductor layer in the outer peripheral portion 135 is formed into the semiconductor layer 103 in a stripe shape, so as to provide the switch element 37. The extending direction of the semiconductor layer 103 may be the same as the extending direction of the memory string 30, or may be a direction crossing the memory string 30.

As shown in FIG. 12B, the word line 24 extends in the Y direction orthogonal to the memory string 30. One end of each word line 24 is drawn out to the outer peripheral portion 135. Word lines 24 are drawn out collectively for each memory block MB. In the outer peripheral portion 135, the extension portion 141 is provided for each memory block.

The extension direction of the word line 24 in one memory block MB is different from other memory block MB adjacent thereto in the X direction. Therefore, an empty space is created between extension portions 141 adjacent in the X direction. Thus, it is possible to dispose the switch element 37 in the empty space between extension portions 141 for controlling each memory block MB. As described above, the switch element 37 is suitable for downsizing, and thus easily disposed in the empty spaces.

As shown in FIG. 12B, the contact portion 47 is provided in the end portion of the word line 24, and the extension portion 141 includes contact portions 47. In this example, the contact portion 47 is drawn out in the X direction orthogonal to the extending direction of the word line 24. The switch element 37 is provided on the side where the contact portion 47 of the extension portion 141 is disposed.

One word line 24 includes the control gate 19 and the conductive layer 15, for example. The contact 19a of the control gate 19 and the contact 15a of the conductive layer 15 are provided in the contact portion 47 (see FIG. 8A). The contact 19a is electrically connected to a row decoder (not-shown), for example. On the other hand, the contact 15a is electrically connected to the switch element 37 via the contact 126. It may be advantageous to connect conductive layers 15 drawn out from one memory block MB to one switch element 37.

Figure 13:
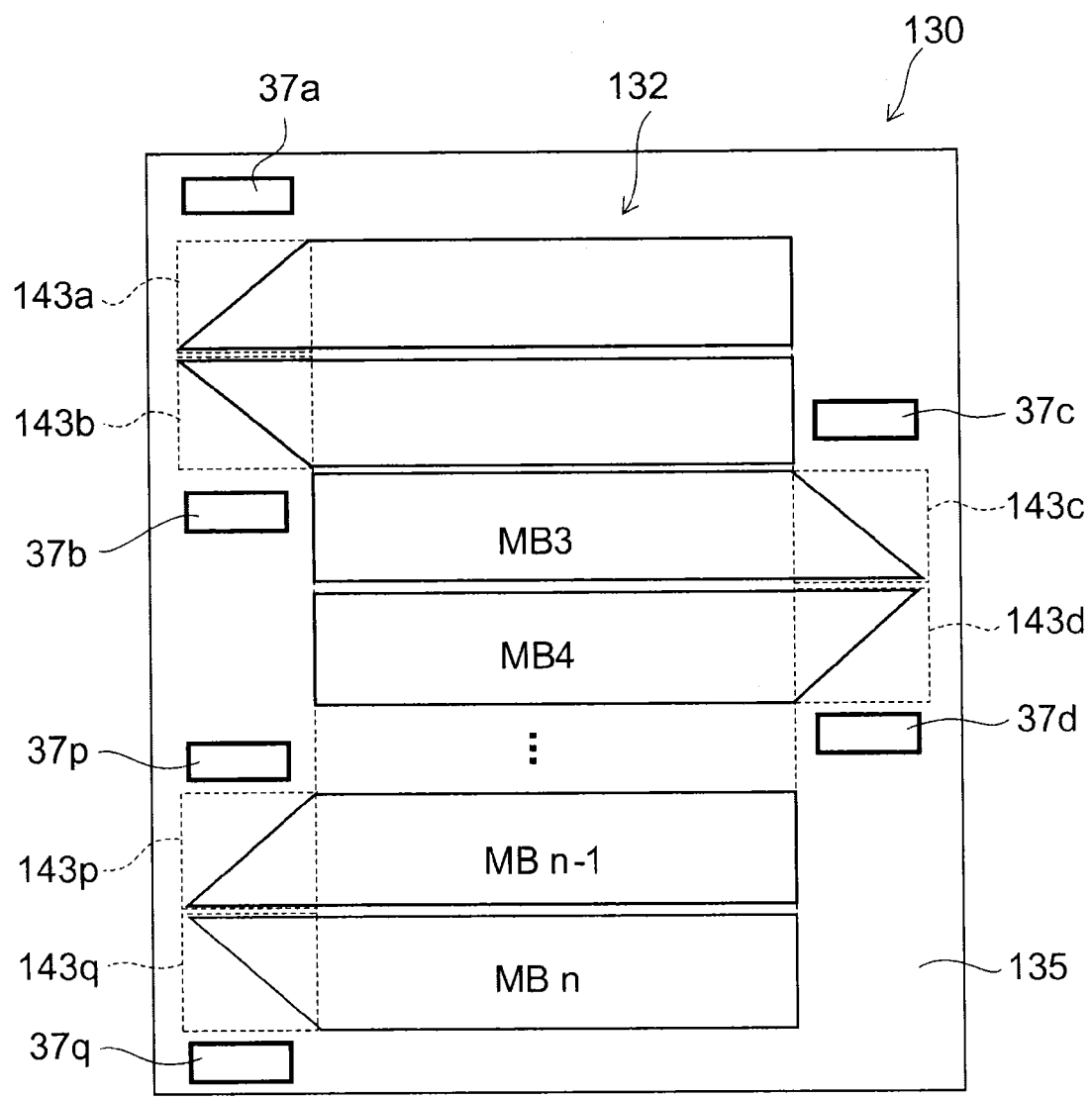
FIG. 13 is an exemplary plan view schematically showing a memory cell portion according to another variation of the first embodiment.

FIG. 13 is an exemplary plan view schematically showing a memory cell portion 132 according to a variation of the first embodiment. In this example, a pair of extension portions 143 of memory blocks MB adjacent to each other in the X direction is provided on the same side of the outer peripheral portion 135 in the Y direction.

That is, the word lines 24 of the memory blocks MB1 and MB2 are drawn out in the Y direction, and the extension portions 143a and 143b are provided to be aligned in the X direction on the same side of the outer peripheral portion 135. On the other hand, the word lines 24 of the memory blocks MB3 and MB4 are drawn out in the −Y direction. The extension portions 143c and 143d are provided to be aligned on the side of the outer peripheral portion 135 opposite to the extension portions 143a and 134b. Each empty space is created on a side of each memory block MB, where the extension portion 143 is not provided. The switch element 37 is provided in these empty spaces.

The switch element 37a that controls the conductive layer 15 of the memory block MB1 is provided in the empty space on the X direction side of the extension portion 134a, for example. On the other hand, the switch element 37b that controls the conductive layer 15 of the memory block MB2 is provided in the empty space on the −X direction side of the extension portion 134b. The switch element 37c that controls the conductive layer 15 of the memory block MB3 is provided on the X direction side of the extension portion 134c. The switch element 37d that controls the conductive layer 15 of the memory block MB4 is provided on the −X direction side of the extension portion 134d.

The memory blocks MBn-1 and MBn have similar configuration. Thus, the switch element 37 can be appropriately provided in the empty space of the outer peripheral portion 135 in accordance with the arrangement of extension portions 143.

Figure 14A:
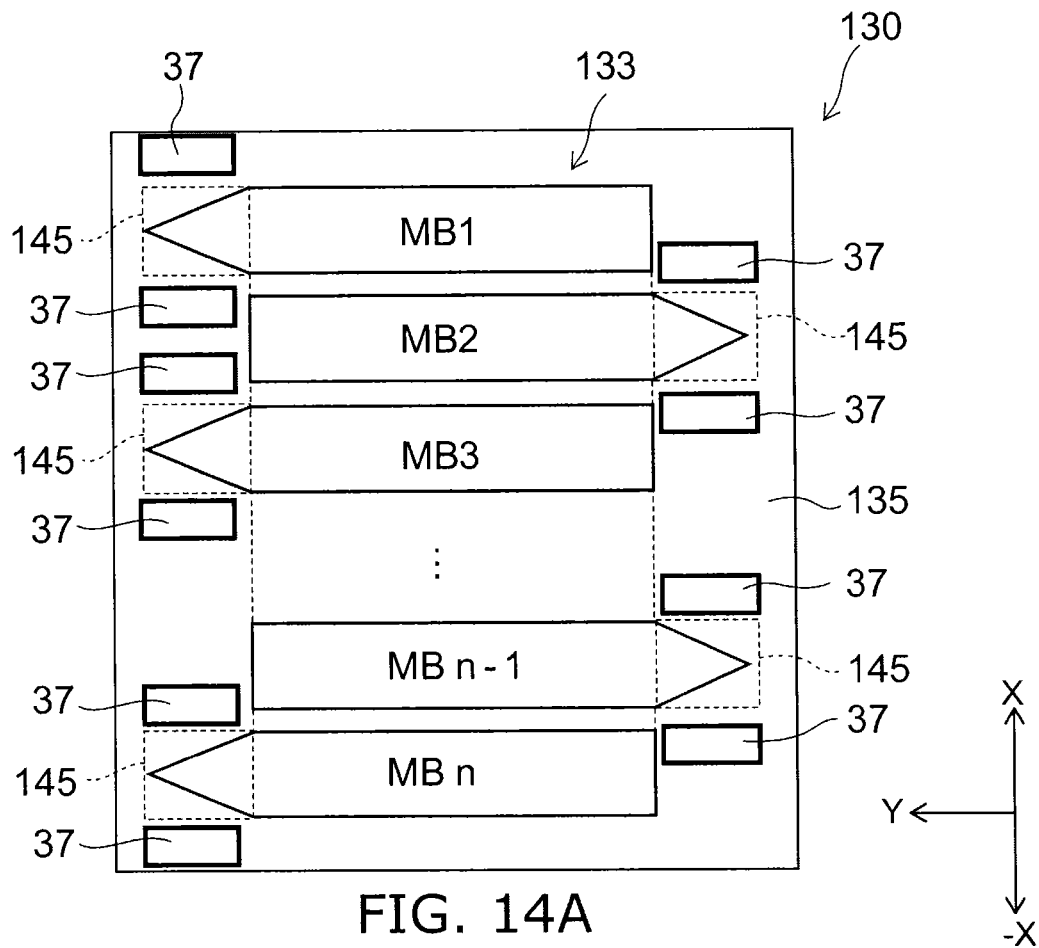
FIGS. 14A and 14B are exemplary plan views schematically showing a memory cell portion according to other variation of the first embodiment.
Figure 14B:
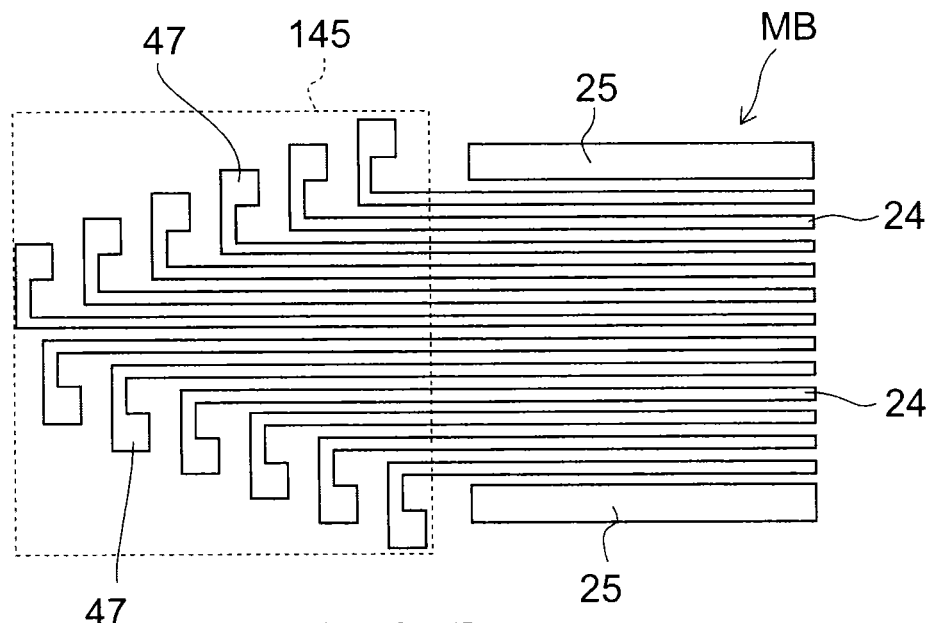

FIGS. 14A and 14B are exemplary plan views schematically showing a memory cell portion 133 according to another variation of the first embodiment. FIG. 14A is a plan view showing the memory cell well 130. FIG. 14B is an enlarged plan view showing the extension portion 145 of the word line 24.

As shown in FIG. 14A, the extension direction of the word line 24 in one memory block MB is different from other memory block MB adjacent thereto in the X direction. Therefore, an empty space is created between extension portions 145 adjacent in the X direction. The switch element 37 is provided in each empty space between extension portions 141 for controlling each memory block MB.

In this example, two switch elements 37 are provided for each memory block MB. The switch element 37 is provided on both sides of the extension portion 145 in the X direction. Corresponding to this arrangement, the contact portions 47 of word lines 24 are drawn out to both sides in the X direction and the −X direction as shown in FIG. 14B. Such a configuration is advantageous when the memory block MB has a larger size and includes a large number of conductive layers 15, for example.

Examples of the switch element 37 and arrangements thereof are described above. According to the embodiment, the switch element 37 controls all conductive layers 15 included in one memory block MB, and one power source 43 (or one power source line) provides charges thereto, for example. Furthermore, the gate structure between the contacts 126 connected to the conductive layers 15 can be provided with low voltage design, and suitable for shrinking the switch element 37. Thereby, the switch element 37 can be easily disposed in the empty space of the memory cell well 130, utilizing the space of the chip surface efficiently. Consequently, the shrinking and cost reduction can be achieved in the non-volatile memory device according to the embodiment.

Second Embodiment

Figure 15A:
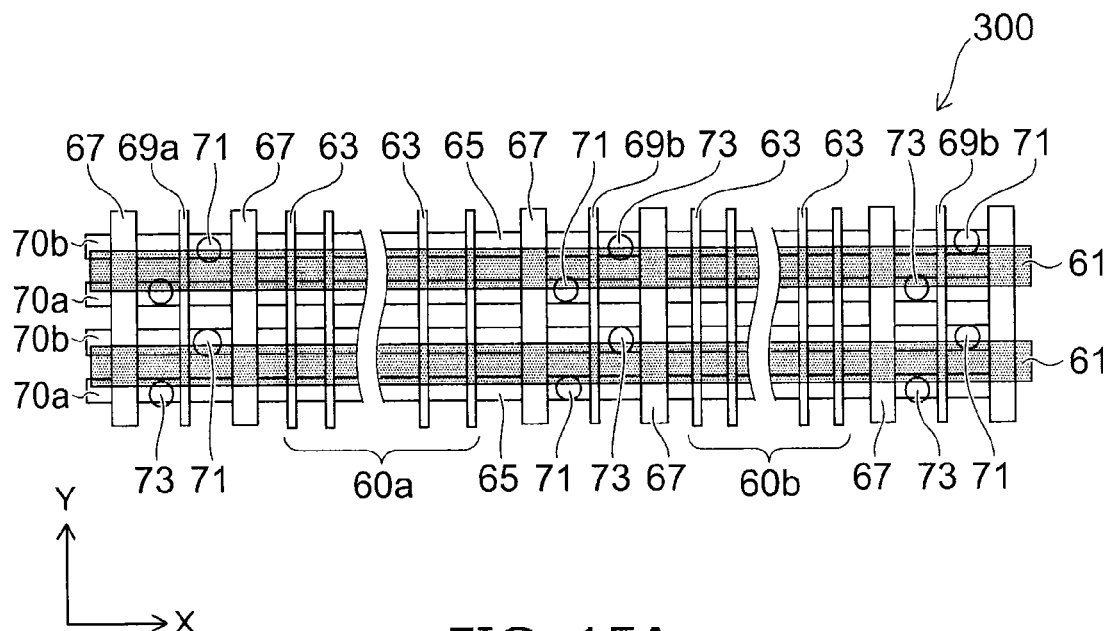
FIGS. 15A and 15B are exemplary diagrams schematically showing a non-volatile memory device according to a second embodiment.
Figure 15B:
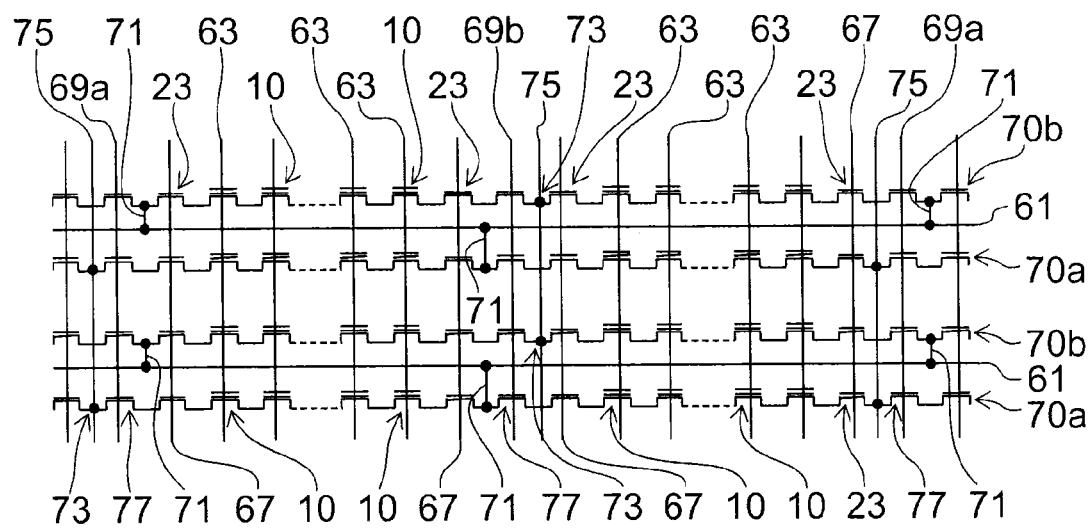
Figure 16A:
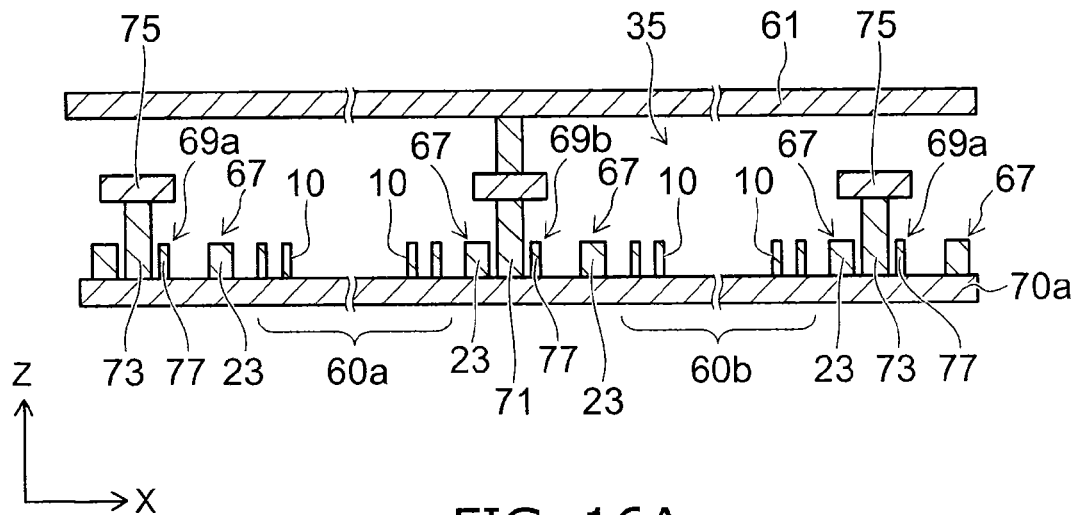
FIGS. 16A and 16B are exemplary cross-sectional views schematically showing the non-volatile memory device according to the second embodiment.
Figure 16B:
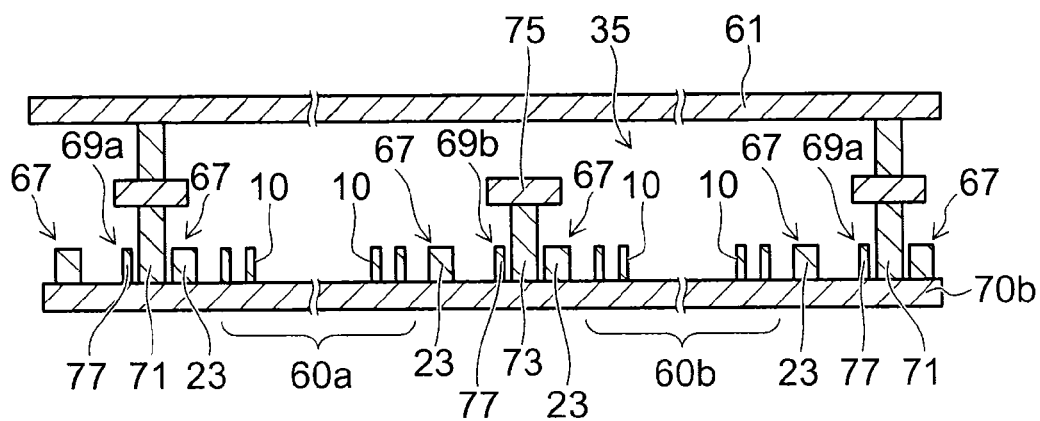

FIGS. 15A and 15B and FIGS. 16A and 16B are exemplary diagrams schematically showing a non-volatile memory device 300 according to a second embodiment. FIG. 15A is a plan view schematically showing the configuration of the memory cell portion, and FIG. 15B is a schematic diagram showing an equivalent circuit of the memory cell portion. FIGS. 16A and 16B are schematic cross-sectional views along the extending direction of a memory string 70. In FIG. 15B, electrical connections similar to those of the conductive layer 15 in FIG. 5B described above are used, and the illustration of a conductive layer 55 described later is omitted.

The non-volatile memory device 300 is a NAND multiple-value flash EEPROM including memory strings 70, for example, and memory strings 70a and 70b adjacent to each other share one bit line 61.

As shrinking memory cell sizes, the line width and the line spacing of bit lines becomes narrower. Therefore, the interconnection resistance and the parasitic capacitance of the bit line become larger, and the time of access to the memory cell via the bit line becomes longer. For example, approximately 50% of the writing time on the memory cell (Program) is spent on the pre-charge of the bit line. If the shrinking of bit lines progresses further, the ratio of the pre-charge time is estimated to be further increased; but the writing time is at a level that does not allow its elongation. To deal with this, in the non-volatile memory device 300 according to the embodiment, the interconnection resistance and the parasitic capacitance are reduced by making two memory strings 70 share one bit line 61.

In the following description, there is a case where memory strings are collectively referred to as "memory strings 70"; and a case where memory strings are referred individually to as a "memory string 70a" and a "memory string 70b", for example. Other elements, such as memory blocks 60 and select gates 69 are also described similarly.

As shown in FIG. 15A, the memory string 70 extends in the first direction (the X direction), and memory strings 70 are aligned in the second direction (the Y direction). The second direction is a direction crossing the first direction; for example, it is orthogonal to the first direction.

A select gate 67 (a first select gate) extending in the Y direction across memory strings 70 is provided. Select gates 67 are aligned in the X direction, and control gates 63 are provided between two select gates 67. The control gate 63 extends in the Y direction across the memory strings 70.

As shown in FIG. 15B, the memory cell 10 is provided at a portion where the control gate 63 intersects the memory string 70. That is, a memory block 60 includes memory cells disposed between two select gates 67. The select transistor 23 is provided at a portion where the select gate 67 intersects the memory string 70.

A drain contact 71 and a source contact 73 are provided on a side of the select gate 67 opposite to the memory block 60. In one memory string 70, the drain contact 71 and the source contact 73 are alternately provided in the X direction, and thus the select gate 67 and the memory block 60 are provided between the drain contact 71 and the source contact 73.

The drain contact 71 and the source contact 73 are provided to be alternately shifted between the memory strings 70a and 70b sharing one bit line 61. Consequently, in one memory block 60, the direction of the current flowing from the drain contact 71 to the source contact 73 is reversed between the memory strings 70a and 70b. The role of the select gate 67 disposed on both sides of the memory block 60 is also reversed between the memory strings.

A select gate 69 (a second select gate) that selects one from the memory string 70a and 70b is provided for one bit line 61. For example, as shown in FIG. 15A, the select gate 69 is disposed between memory blocks 60 adjacent to each other, and extends in the Y direction across the memory strings 70. One of the drain contact 71 and the source contact 73 is disposed between the select gates 69a and 96b located on both sides of one memory block 60.

Thus, it becomes possible to dispose one select gate 69 between a set of the drain contact 71 and the source contact 73 in one memory string 70. That is, there is no case where the select gate 69 extending over both the memory strings 70a and 70b is provided between the drain contact 71 and the source contact 73 disposed across one memory block 60; and one of the select gates 69a and 69b is disposed for each memory string.

As shown in FIG. 15B, the bit line 61 and the memory string 70 are electrically connected via the drain contact 71. On the other hand, a source line 75 and the memory string 70 are electrically connected via the source contact 73. A select transistor 77 is provided at a portion where the select gate 69 intersects the memory string 70.

FIG. 16A is a cross-sectional view along the X direction of the memory string 70a, and FIG. 16B is a cross-sectional view along the X direction of the memory string 70b.

Two interconnection layers including the source line 75 and the bit line 61 are provided on the upper side (in the Z direction) of the memory string 70, for example. The interlayer insulating film 35 electrically insulates the bit line 61 from the source line 75, and the bit line 61 is provided above the source line 75.

As shown in FIG. 16A, the memory string 70a includes the memory block 60 in which memory cells 10 are aligned in the X direction and the select gates 67 provided on both sides of the memory block 60. The drain contact 71 or the source contact 73 is provided on a side of the select gate 67 opposite to the memory block 60. The drain contact 71 electrically connects the memory string 70a to the bit line 61. The source contact 73 electrically connects the memory string 70a to the source line 75.

In the memory string 70b shown in FIG. 16B, the drain contact 71 and the source contact 73 are provided so as to be shifted in the X direction from the memory string 70a. Therefore, the drain contact 71 and the source contact 73 are reversely disposed as compared to the memory string 70a in one memory block 60.

As shown in FIG. 16A and FIG. 16B, the select gate 69a locates between the source contact 73 and the select gate 67, and controls the current flowing of the memory string 70a in the memory block 60a. The select gate 69b locates between the select gate 67 and the source contact 73, and controls the current of the memory string 70b in the memory block 60a. For another memory block 60b, the select gate 69b locates between the drain contact 71 and the select gate 67, and controls the current flowing in the memory string 70a. The select gate 69a locates between the select gate 67 and the drain contact 71, and controls the current flowing of the memory string 70b in the memory block 60b.

When selecting the memory block 60a, the select gates 67 provided on both side of the memory block 60a are biased so that the memory strings 70a and 70b in the memory block 60a become active. Then, the select gate 69a or the select gate 69b is biased to switch the select transistor 77 to the ON state. When the select gate 69a is biased, the memory string 70a is electrically connected to the bit line 61 via the drain contact 71, for example. On the other hand, when the select gate 69b is biased to switch the select transistor 77 to the ON state, the memory string 70b is electrically connected to the bit line 61 via the drain contact 71. When selecting the memory block 60b, the select gate 69a connects the memory string 70b to the bit line 61, and the select gate 69b connects the memory string 70a to the bit line 61.

Thus, in the embodiment, the drain contact 71 and the source contact 73 are reversely disposed between the memory strings 70a and 70b adjacent to each other, and the select gate 69 is provided to select one of the memory strings 70a and 70b. Thereby, it becomes possible to access one of the memory strings 70a and 70b via one bit line 61.

Figure 17:
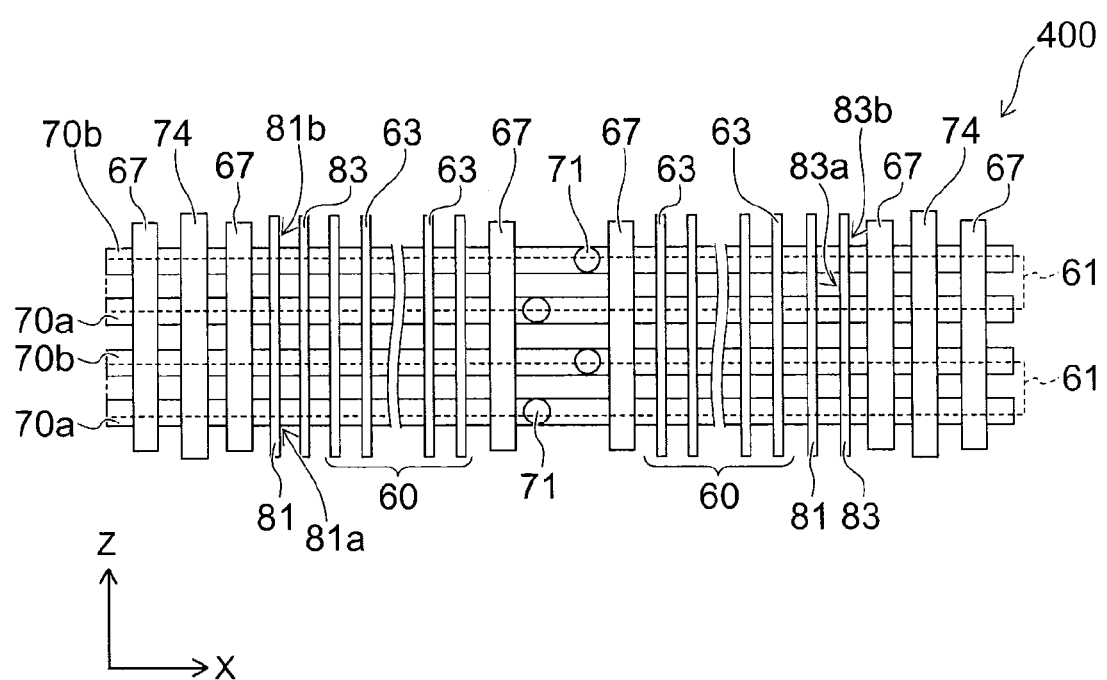
FIG. 17 is a schematic view showing a non-volatile memory device according to another comparative example.

FIG. 17 is a schematic view showing a non-volatile memory device 400 according to a comparative example. In the comparative example, memory strings 70a and 70b share one bit line 61. Two select gates 81 and 83 provided between the select gate 67 and a source line 74 may select one of the memory strings 70a and 70b.

As shown in FIG. 17, memory strings 70 extending in the X direction are aligned in the Y direction. The select gate 67 is provided on both sides of the memory block 60 sharing the control gate 63 extending in the Y direction, and the drain contact 71 and the source contact 74 are disposed respectively on a side of the select gate 67 opposite to the memory block 60. The drain contact 71 electrically connects the memory string 70 to the bit line 61. The source contact 74 electrically connects the memory string 70 to the source line 75 (not-shown).

In the comparative example, the drain contacts 71 are provided on the same side of the memory block 60 in the memory strings 70a and 70b adjacent to each other. On the other hand, the source contact 74 is provided to extend over the memory strings 70 on a side of the memory block 60 opposite to the drain contact 71. Therefore, the direction of the current flowing from the drain contact 71 to the source contact 74 via each memory string is the same between the memory strings 70a and 70b adjacent to each other.

In order to share one bit line 61 between the memory strings 70a and 70b in such a configuration, a pair of the select gates 81 and 83 is needed for selecting one of the memory strings 70a and 70b.

The select gate 81 extends in the Y direction, and includes select transistors 81a and 81b at the intersections with the memory strings 70a and 70b, respectively. The select transistor 81a is an enhancement MOS transistor, and the select transistor 81b is a depletion MOS transistor, for example. When a control voltage is applied to the select transistor 81, the select transistor 81a is switched from the OFF state to the ON state. On the other hand, the select transistor 81b is constantly in the ON state.

The select gate 83 also extends in the Y direction, and includes select transistors 83a and 83b at the intersections with the memory strings 70a and 70b, respectively. The select transistor 83a is a depletion MOS transistor, and the select transistor 81b is an enhancement MOS transistor, for example. When a control voltage is applied to the select gate 83, the select transistor 83b is switched from the OFF state to the ON state. On the other hand, the select transistor 81a is constantly in the ON state.

By aligning the select gates 81 and 83 like these in the X direction, the current path between the drain contact 71 and the source line 74 can be set to the OFF state. By applying a control voltage to the select gate 81, the current path flowing through the memory string 70a can be set to the ON state. By applying a control voltage to the select gate 83, the current path flowing through the memory string 70b can be set to the ON state. Thereby, it becomes possible to access one of the memory strings 70a and 70b through one bit line 61.

However, it is difficult to fabricate an enhancement MOS transistor and a depletion MOS transistor respectively in the memory strings 70a and 70b adjacent to each other in the highly miniaturized memory cell portion.

In contrast, in the embodiment, the drain contact 71 and the source contact 73 are reversely disposed between the adjacent memory strings 70a and 70b. Thereby, it becomes possible to access one of the memory strings 70a and 70b using the select gate 69 providing only enhancement MOS transistors.

Since the select gate 69 needs only to select one of the two memory strings 70, the select transistors 77 sharing the select gate 69a may be formed with a smaller size than the select transistors 23 sharing the select gate 67. For example, the select transistor 77 may have the same structure and size as the memory cell 10.

Thus, the non-volatile memory device 300 according to the embodiment can be manufactured easily, and can be provided using the same process and manufacturing apparatus as those for a non-volatile memory device in which the bit line is not shared.

Next, operations of the non-volatile memory device 300 are described with reference to Table 2 to Table 4. Table 2 shows operating states of the memory string 70a, and Table 3 shows operating states of the memory string 70b. Table 4 shows operating states of both the memory strings 70a and 70b.

TABLE 2

| Memory String 70a | Source | SGS | SGD | Drain | BLS1 69a | BLS2 69b |
|---|---|---|---|---|---|---|
| Read | 0 V | Vsg | Vsg | Vb1 | Vread | — |
| Non Read | 0 V | Vsg | Vsg | Vb1 | 0 V | — |
| Program | Vdd | 0 V | Vdd | 0 V | Vpass | — |
| NON Program | Vdd | Vdd | 0 V | 0 V | Vpass | — |
| Erase | | | | Floating | | |

As shown in Table 2, when stored information is read out from the memory string 70a of the memory block 60a (Read), each element is set as follows. The source contact 73 (Source) is 0 V; the select gate 67 on the source side (SGS) and the select gate 67 on the drain side (SGD) are Vsg; the drain contact 71 (Drain) is Vb1; and the select gate 69a (BLS1) is Vread. The select gate 69b (BLS2) is irrelevant to the operation of the memory string 70a in the memory block 60a. On the other hand, when information is not read out from the memory string 70a (NonRead), BLS1 is 0 V, and the others are the same. When BLS1 is 0 V, the select gate 69a is in the OFF state, and no current flows through the memory string 70a.

Here, Vsg is the voltage that switches the select gate 67 to the ON state, and Vb1 is the voltage of the bit line 61. Vread means switching the select gate 69 to the ON state in reading.

Next, when information is written on the memory string 70a of the memory block 60a (Program), each element is set as follows. Source is Vdd; SGS is 0 V; SGD is Vsg; Drain is 0 V; and BLS1 is Vpass. Here, Vpass means switching the select gate 69 to the ON state in writing. On the other hand, when information of the memory string 70a is not written (NonRead), SGS is Vsg; SGD is 0 V; and the others are the same as those of writing.

In the case of the memory string 70b shown in Table 3, the operations of Source, SGS, SGD, and Drain are the same as those of the memory string 70a. When stored information is read out from the memory string 70b, BLS2 is Vread. In both cases where information is written on the memory string 70b, and information is not written on the memory string 70b, BLS2 is Vpass.

That is, when reading out information from the memory string 70a or 70b, it may be possible to select one of the memory string 70a or 70b using the select gate 69. On the other hand, when writing information, the select gate 67 controls the bias states of the memory strings 70a and 70b. At this time, the select gate 69 is in the ON state while writing information. That is, the select gate 69 is set to the ON state so that one of the memory strings 70a and 70b becomes active for writing information.

TABLE 3

| Memory String 70b | Drain | SGD | SGS | Souce | BLS1 69a | BLS2 69b |
|---|---|---|---|---|---|---|
| Non Read | Vb1 | Vsg | Vsg | 0 V | — | 0 V |
| Read | Vb1 | Vsg | Vsg | 0 V | — | Vread |
| NON Program | 0 V | 0 V | Vdd | Vdd | — | Vpass |
| Program | 0 V | Vdd | 0 V | Vdd | — | Vpass |
| Erase | | | | Floating | | |

Table 4 is a summary of the operations mentioned above. When the memory string 70a is programmed, Vsg is applied to SGD to switch the select transistor 23 to the ON state, and Drain bias of 0 V is transferred to the channel of the memory cell 10 to enable programming, for example. The select transistor 23 is not switched to the ON state, and Source bias of Vdd is not transferred, since SGS is 0 V.

In the memory string 70b, Vsg is applied to SGS to switch the select transistor 23 to the ON state. Thereby, the Source bias of Vdd is transferred to the channel of the memory cell 10 to cause a channel boost, and thus programming is not performed. On the other hand, the select transistor 23 is not switched to the ON state, and the Drain bias of 0 V is not transferred, since SGD is 0 V. When erasing information stored in the memory strings 70a and 70b, all of Source, SGS, SGD, Drain, BLS1, and BLS2 are set to a floating state (Floating). Thus, it is found that the non-volatile memory device 300 according to the embodiment satisfies all the operating conditions, such as Program, Non-Program, Erase, and Read.

TABLE 4

|  | Source | SGS | SGD | Drain | BLS1 69a | BLS2 69b |
|---|---|---|---|---|---|---|
| Read 70a | 0 V | Vsg | Vsg | Vb1 | Vread | 0 V |
| Read 70b | 0 V | Vsg | Vsg | Vb1 | 0 V | Vread |
| Program | Vdd | 0 V | Vdd | 0 V | Vpass | Vpass |
| NON Program | Vdd | Vdd | 0 V | 0 V | Vpass | Vpass |
| Erase |  |  |  | Floating |  |  |

The embodiments mentioned above illustrate examples in which the memory strings 70a and 70b are alternately arranged in one memory block 60, and the direction of the current flowing from the drain contact 71 to the source contact 73 is alternately reversed between the memory strings 70a and 70b. However, the embodiment is not limited thereto. That is, it is possible to dispose the memory strings 70a, 70b, 70b, and 70a in this order, so that the direction of current flowing is opposite between the memory strings 70a and 70b that share one bit line 61.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A non-volatile memory device comprising:
a memory cell including a semiconductor layer, a charge storage layer provided on the semiconductor layer, and a first insulating film provided between the semiconductor layer and the charge storage layer, the semiconductor layer having a stripe shape extending in a first direction;
a first conductive layer provided on the charge storage layer, the first conductive layer extending in a second direction crossing the first direction;
a second conductive layer provided between the charge storage layer and the first conductive layer, the second conductive layer extending in the second direction;
a second insulating film provided between the charge storage layer and the second conductive layer; and
a third insulating film provided between the first conductive layer and the second conductive layer.

2. The device according to claim 1, further comprising a switch element electrically connected to the second conductive layer.

3. The device according to claim 1, wherein
the second conductive layer includes a metal film and
the second insulating film and the third insulating film include at least one of a silicon oxide film and a silicon nitride film.

4. The device according to claim 1, further comprising an insulating layer provided on both sides of the semiconductor layer, and extending in the first direction,
wherein an upper surface of the charge storage layer locates at the same level as an upper surface of the insulating layer.

5. A non-volatile memory device comprising:
a memory cell portion including memory cells,
each memory cell including:
a charge storage layer provided on a semiconductor layer, the semiconductor layer having a stripe shape in the memory cell portion, and extending in a first direction, wherein the memory cells are disposed along the stripe-shaped semiconductor layer;
a first insulating film providing between the semiconductor layer and the charge storage layer;
a first conductive layer provided on the charge storage layer, the first conductive layer extending in a direction crossing the first direction;
a second conductive layer provided between the charge storage layer and the first conductive layer, the second conductive layer extending in the direction crossing the first direction;
a second insulating film provided between the charge storage layer and the second conductive layer; and
a third insulating film provided between the first conductive layer and the second conductive layer; and
a peripheral portion surrounding the memory cell portion, and including an extension portion including an end portion of the first conductive layer and an end portion of the second conductive layer.

6. The device according to claim 5, wherein
the end portion of the first conductive layer includes a first contact and
the end portion of the second conductive layer includes a second contact.

7. The device according to claim 5, wherein the extension portion includes an end portion of the first conductive layer provided on the second conductive layer via the third insulating film and an end portion of the second conductive layer extending outward from an end portion of the first conductive layer.

8. A non-volatile memory device comprising:
a memory cell portion including memory cells,
each memory cell including:
a charge storage layer provided on a semiconductor layer;
a first insulating film providing between the semiconductor layer and the charge storage layer;
a first conductive layer provided on the charge storage layer;
a second conductive layer provided between the charge storage layer and the first conductive layer;
a second insulating film provided between the charge storage layer and the second conductive layer; and
a third insulating film provided between the first conductive layer and the second conductive layer;
a peripheral portion surrounding the memory cell portion, and including an extension portion including an end portion of the first conductive layer and an end portion of the second conductive layer; and
a switch element provided in the peripheral portion and electrically connected to the second conductive layer,
wherein the switch element includes:
a stripe-shaped semiconductor layer extending to a second direction;
a gate electrode including:
first extension portions extending in a direction crossing the second direction;
a second extension portion extending in a direction crossing the second direction; and
a connection portion electrically connecting the first extension portions and the second extension portion;

first source drain regions provided in the stripe-shaped semiconductor layer on both side of each first extension portion, each first source drain region having a different conductivity type from the stripe-shaped semiconductor layer, and electrically connected to the second conductive layer;

a second source drain regions provided in the stripe-shaped semiconductor layer on a side of the second extension portion opposite to the first extension portion, and the second source drain region having a different conductivity type from the semiconductor layer; and a fourth insulating film provided between the gate electrode and the stripe-shaped semiconductor layer.

9. The device according to claim 8, wherein the first extension portion is wider in an extending direction of the semiconductor than the second extension portion.

10. The device according to claim 8, wherein the fourth insulating film is thicker than the first insulating film.

11. The device according to claim 8, further comprising:
switch elements provided in the outer peripheral portion,
wherein the memory cell portion includes memory cell blocks, each memory block including memory cells, and
the extension portions are drawn out from one of the memory cell blocks, and electrically connected to one of the switch elements.

12. A method for manufacturing a non-volatile memory device,
the device including:
a memory string including memory cells aligned in a first direction, each of the memory cells including a semiconductor layer, a charge storage layer provided on the semiconductor layer, and a first insulating film provided between the semiconductor layer and the charge storage layer;
first conductive layers extending in a second direction crossing the first direction, each first conductive layer being provided on a charge storage layer of a memory cell;
second conductive layers extending in the second direction, each second conductive layers being provided between a charge storage layer and a first conductive layer, and;
a second insulating film provided between a charge storage layer and a second conductive layer; and
a third insulating film provided between a first conductive layer and a second conductive layer,
the method comprising:
forming an intermediate pattern including an end portion joining a pair of the first conductive layers and another end portion joining a pair of the second conductive layers; and
dividing the intermediate pattern into the two contact portions, each contact portion having a stacked structure including one of the first conductive layers, the third insulating film, and one of the second conductive layers.

* * * * *